United States Patent [19]
Rompaey et al.

[11] Patent Number: 5,870,588
[45] Date of Patent: Feb. 9, 1999

[54] DESIGN ENVIRONMENT AND A DESIGN METHOD FOR HARDWARE/SOFTWARE CO-DESIGN

[75] Inventors: Karl Van Rompaey, Heist-ap-den-Berg; Diederik Verkest, Kapellen; Jan Vanhoof, Wijmaal; Bill Lin, Leuven; Ivo Bolsens, Schoten; Hugo De Man, Leuven, all of Belgium

[73] Assignee: Interuniversitair Micro-Elektronica Centrum(IMEC vzw), Belgium

[21] Appl. No.: 735,681

[22] Filed: Oct. 23, 1996

Related U.S. Application Data

[60] Provisional application No. 60/019,867 Jun. 17, 1996 and provisional application No. 60/006,012 Oct. 23, 1995.

[51] Int. Cl.$^6$ .................................... G06F 17/50
[52] U.S. Cl. .................... 395/500; 395/680; 395/682; 395/683; 395/705; 364/489; 364/490
[58] Field of Search ................... 364/489, 490, 364/578; 395/500, 680, 682, 683, 684, 705, 707, 823, 831, 828

[56] References Cited

U.S. PATENT DOCUMENTS

| | | | |
|---|---|---|---|
| 4,922,432 | 5/1990 | Kobayashi et al. ..................... | 364/490 |
| 5,175,856 | 12/1992 | Van Dyke et al. ..................... | 395/700 |
| 5,197,016 | 3/1993 | Sugimoto et al. ..................... | 364/490 |
| 5,247,651 | 9/1993 | Clarisse .................................. | 395/500 |
| 5,493,508 | 2/1996 | Dangelo et al. ......................... | 364/489 |
| 5,692,193 | 11/1997 | Jagannathan et al. .................. | 395/676 |

OTHER PUBLICATIONS

Paulin et al., "Force Directed Scheduling for the Behavorial Synthesis of ASIC's", IEEE, 1989, pp. 661–679.
Bealkowski et al., "A Heterogenous Multiprocessor Architecture for Workstations", IEEE, 1991, pp. 258–262.
Thomas et al., "A Model and Methodology for Hardware–Software Codesign", IEEE, 1993, pp. 6–5.
Wenban et al., "Codesign of Communication Protocols", IEEE, 1993, pp. 46–52.
Srivastava et al., "System Level Hardware Module Generation", IEEE, 1995, pp. 20–35.
Mohanly et al., "Rapid System Protype, System Modeling, and Analysis in a Hardware–Software Codesign Enviroment", IEEE, 1995, pp. 154–160.
Stoel et al., "VIOOL for Hardware/Software Codesign", IEEE, 1995, pp. 333–340.
Ade et al, "Hardware–Software Codesign with Grape", IEEE, 1995, 40–47.
Gupta et al., "Hardware–Software Cosynthesis for Digital Systems", IEEE, 1993, pp. 29–41.
Verkest et al., "CoWare—A Design Enviroment for Heterogenous Hardware/Software Systems," *Design Automation for Embedded Systems*, 1, pp. 357–386 (1996).
Van Rompaey et al., "CoWare—A design enviroment for heterogenous hardware/software systems," *IEEE*, pp. 252–257 (1996).
Bolsens et al., "User Requirements for Designing Complez Systems on Silicon[1]" *IEEE*, pp. 63–72 (1994).

(List continued on next page.)

*Primary Examiner*—Kevin J. Teska
*Assistant Examiner*—Thai Phan
*Attorney, Agent, or Firm*—Knobbe, Martens, Olson & Bear, LLP

[57] ABSTRACT

A hardware and software co-design environment and design methodology based on a data-model that allows one to specify, simulate, and synthesize heterogeneous hardware and software architectures from a heterogeneous specification. The environment and methodology of the invention allow for the interactive synthesis of hardware and software interfaces. The environment defines primitive objects to represent a specification of an essentially digital system. The primitive objects are defined by describing the specification of the system in one or more processes, each process representing a functional aspect of the system. Further, each of the processes have ports which are connected to ports of other processes with a channel. The ports structure communication between the processes.

46 Claims, 18 Drawing Sheets

OTHER PUBLICATIONS

De Man et al., "Co–Design of DSP Systems," Jan. 1996, pp. 1–30.

De Man et al., "Co–Design of DSP Systems," presented at NATO Advanced Study Instittute on Hardware/Software Co–Design, Jun. 1995, pp. 1–54.

Berrebi, E., et al. (1996) Combined control flow dominated and data flow dominated high–level synthesis. Proceeding of the 33rd. Design Automation 1,13 Conference 1996, Las Vegas, Jun. 3–7, 1996.

Buck, J., et al. (1994) Ptolemy: a framework for simulating and prototyping heterogenous systems. International Journal in Computer Simulation 4:155–182.

Chou, P., et al. (1992) Synthesis of the hardware/software interface in microcontroller–based systems. Proceedings of the IEEE International Conference on Computer–Aided Design, ICCAD 92, pgs. 488–495.

Ismail, T., et al. (1995) Synthesis steps and design models for codesign. Computer 28(2):44–52.

Narayan, S., et al. (1992) System specification with the speccharts language. IEEE Design and Test of Computers 9(4):6–13.

Paulin, P., et al. (1995) High–level synthesis and codesign methods: an application to a videophone codec. Euro–Dac: European Design Automation Conference with Euro VHD, Brighton, Sept. 18–22, 1995.

Vahid, F., et al. (1995) Speccharts: a VHDL front–end for embedded systems. IEEE Transactions on Computer Aided Design of Integrated Circuits and Test Conference, Mar. 6, 1995.

Valderrama, C.A., et al. (1995) A unified model for co–simulation and co–synthesis of mixed hardware/software systems. European Design and Test Conference, Mar. 6, 1995.

Woo, N., et al. (1994) Codesign from cospecification. Computer 27 (1): 42–47.

DESIGN ENVIRONMENT AND A DESIGN METHOD FOR HARDWARE/SOFTWARE CO-DESIGN

This application claims benefit of provisional application 60/019,867 filed Jun. 17, 1996 and provisional application 60/006,012 filed Oct. 23, 1995.

BACKGROUND OF THE INVENTION

1. Field of the Invention

The present invention relates to a design environment and a design method for hardware/software co-design. More specifically the hardware/software co-design of this invention comprises the specification, synthesis, and simulation of heterogeneous systems.

2. Description of the Related Technology

Digital communication techniques form the basis of the rapid breakthrough of modern consumer electronics, wireless and wired voice- and data networking products, broadband networks and multi-media applications. Such products are based on digital communication systems, which are made possible by the combination of VLSI technology and digital signal processing.

Digital systems perform real-time transformations on time discrete digitized samples of analogue quantities with finite bandwidth and signal to noise ratio. These transformations can be specified in programming languages and executed on a programmable processor or directly on application specific hardware. The choice is determined by trade-offs between cost, performance, power and flexibility. Hence digital systems are a candidate par excellence for hardware-software co-design.

In contrast to analogue processing, digital processing guarantees perfect reproducibility, storage and testability. Signal quality is a matter of exact mathematical operations. The price paid is the cost of hardware and the performance needed to satisfy the hard real-time character. This problem is now solved by the abundance of digital VLSI (Very Large Scale Integration) technology which provides for cheap storage and high speed computation. Therefore, the combination of VLSI technology and digital processing has made possible the breakthrough of modern consumer electronics, portable and personal communication, broadband networks, multi-media, and automotive applications.

The design process of the products for these applications is subject to a number of constraints. A first constraint is that they must be implemented in silicon or another hardware platform for power, performance and cost reasons. A second constraint is that these products implement systems conceived by a highly specialized system team thinking in terms of executable concurrent programming paradigms which, today, are not well understood by hardware designers. Hence most specifications are first translated into English and then redesigned in a specific hardware description language such as Very High Speed Integrated Circuit (VHSIC) Hardware Description Language (VHDL) or VERILOG for the hardware components and a software description language such as C or assembler for the software components. Although the hardware and software have tight interaction, both hardware and software are designed separately. Only after system assembly, are the software and hardware run together. As a consequence, the design can be far from optimal or even erroneous, making a redesign cycle mandatory.

This gap between system design and implementation is rapidly becoming the most important bottleneck in the design process of such products and systems. However, constraint is that for reasons of cost-effectiveness and time-to-market, there is a need to increase design productivity by at least an order of magnitude. Yet another constraint is that re-use of designs as well as a design for re-use methodology will have to be adopted. This methodology implies hardware/software co-design at several levels of implementation.

J. Buck et al. in "PTOLEMY: A framework for simulating and prototyping heterogeneous systems" (International Journal on Computer Simulation, January 1994) focus on an environment for hardware/software co-simulation. The proposed methodology only allows for hardware/software co-design of systems based on a data-flow algorithm. Furthermore, hardware/software interface synthesis is not supported.

U.S. Pat. No. 5,197,016 discloses a computer-aided system and method for designing an application specific integrated circuit (ASIC) whose intended function is implemented both by hardware subsystems and software subsystems. The proposed methodology only allows for a single processor design and is only valid for specifications based on a state transition diagram. The hardware/software co-design of systems based on a heterogeneous specification is not supported.

S. Narayan, F. Vahid, and D. Gajski. in "System specification with the SpecCharts language" (IEEE Design & Test of Computers, pages 6–13, December 1992) disclose a methodology that builds on VHDL. The methodology does not support the hardware/software co-design of systems based on a heterogeneous specification.

P. Chou, R. Ortega, and G. Borriello. in "Synthesis of the hardware/software interface in microcontroller-based systems" (Proceedings of the IEEE International Conference on Computer-Aided Design, ICCAD 92, pages 488–495, November 1992) show a method for hardware/software interface generation for microcontroller based systems. This method assumes that the user determines the software interfacing such as the communication with drivers before the start of the system synthesis task.

Neither of the prior art solutions provides a design environment based on a data-model that allows one to specify, simulate and implement or synthesize heterogeneous hardware/software implementations starting from a heterogeneous system specification. In the following paragraphs of this section an analysis is made of the characteristics of specifications of such heterogeneous systems.

In the strictest sense digital systems are algorithms mapping digital signals into digital signals in real-time. The real-time constraint is determined by the repetition period of the algorithm for consuming an input frame and producing a new output frame. The periodicity of this constraint and the nature of the signals leads to the fact that the elementary algorithm is a data-flow function.

A synchronous data-flow (SDF) algorithm can be modeled as an acyclic graph where nodes are operators and edges represent data-precedences. This graph is called a data-flow graph. An operator can execute when a predetermined, fixed number of data (tokens) are present at its input and then it produces one or more output data (tokens). Conditional selection of two operations to a single output is allowed. Operators have no state but arrays resulting from one algorithm execution can be saved for reuse in future executions (delay operator). Many digital processing algorithms are of this type. They can be described very efficiently by so-called applicative programming languages like SILAGE.

In contrast to SDF algorithms, dynamic data-flow (DDF) algorithms contain data-dependent token production and consumption. They allow for while and if-then-else programming constructs.

Computer-Aided Design (CAD) environments for digital systems such as DSP-Station of Mentor Graphics, PTOLEMY, GRAPE-II of COSSAP all allow for specification of SDF and DDF and use as much as possible static scheduling to provide simulation speeds that are up to two orders of magnitude faster than event driven simulators such as in use for VHDL. This justifies the use of these simulation paradigms for digital system specification and validation.

However, when we consider digital processing systems in the broad sense, a wider scope is necessary as illustrated in FIG. 1 which is an abstraction of many practical implementations of digital processing systems. A careful look at FIG. 1 allows us to identify five common characteristics of digital processing system specifications as follows:

1) Digital systems typically comprise one (or more) signal paths 1 as well as slow control loops 2 and a reactive control system 3 taking events 4 of a slow environment such as a user interface (UI) 5 and slow status information 6 of the signal paths as inputs to control the mode or parameters of the signal paths.

2) A signal path 1 is usually a concatenation of data-flow functional blocks (DFBs) 7, such as h1, h2, . . . , L2, often operating at fairly different data- and execution-rates and transforming the format of the data. The rate and format differences naturally result from operations such as: frequency down- or up-conversion, bit to symbol modulation, data-compression and error correction coding. When these DFBs operate on unfragmented signal words, they can best be specified as data-flow algorithms (e.g., in SILAGE, data-flow language (DFL), or C). Others that manipulate individual bits of the signals can be directly specified as Finite State Machines with Data paths (FSMD) at VHDL register transfer or behavioral level. Hence the specification format depends on the type of data-flow functional block.

3) DFBs in the signal path are internally strongly interconnected data-flow graphs with sparse external communication. Hence, from an implementation viewpoint, they are seldom partitioned over several hardware or software components. Rather they will be merged onto the same component if throughput and rate constraints allow. Merging implies sequentializing the concurrent processes on a single component while still satisfying the timing constraints. This requires software synthesis encapsulation techniques of single thread compilers to allow real-time scheduling of concurrent processes.

4) Control loops and mode control by parameter setting are common to almost all digital processing systems. For example, all digital communication systems have tracking and acquisition loops to synchronize frequency and phase of the receiver signal path 1 to the characteristics of the incoming signal. Design of these loops is one of the most difficult tasks since their characteristics depend strongly on noise and distortion properties of the communication channel. It involves the design of phase-locked loops, delay-locked loops, and fast Fourier transforms, controlled by "events" disturbing the regularity of the signal streams. The occurrence rate of these events is orders of magnitude slower than the data-rate in the signal path. Hence, similar to the UI, the processes modeling these slow control loops and mode setting have no data-flow but reactive semantics. They run concurrently with the data-flow and often consist themselves of concurrent processes. Such a control dominated system can be described as a Program State Machine (PSM), which is a hierarchy of program-states, in which each program-state represents a distinct mode of computation. Formalisms such as StateCharts or SpecCharts, which include behavioral hierarchy, exception handling and inter-process communication modeling are needed to describe such systems. In practice, very often synchronization is specified in one or more concurrent C programs.

5) Digital systems contain both high and low data-rate blocks in the signal path. High data-rate blocks are synthesized directly in hardware. Low data-rate blocks are candidates for implementation on programmable processors. Hence, digital systems are natural candidates for hardware/software co-design.

From the above it follows that digital systems require a combination of data-models for their specification. Specification languages are tightly coupled to these data-models, paradigms, simulators, and synthesis tools.

Nowadays, the dominant specification language of the digital system designer is C or a DFL for the main signal path whereas FSMDs and PSMs are usually described in a Hardware Description Language (HDL). For the description of communication channels and communication protocols other formalisms such as timing diagrams, Extended Signal Transition Graphs, and Communicating Sequential Processes must be considered. A CAD system for digital systems must be able to encapsulate all these paradigms and there associated languages and design environments.

Digital systems design thus requires the ability to mix data-flow and reactive paradigms with widely different time constants. The difference in time constants between control- and data-flow poses special problems in simulation. It requires all processes to be simulatable at the highest possible abstraction level.

Not only the specification of a digital system is heterogeneous by nature. Also the implementation architecture of a digital system is heterogeneous. An example implementation architecture comprises the following types of components and the communication between these components:

programmable processors.
application specific processors with hardwired controller.
application specific processors with specialized instruction set.
hardware accelerators
micro controllers
communication blocks and memory
peripherals (DMA, UART, and so forth)

Thus, a design method for a digital system must bridge the gap between the heterogeneous specification of the system and its heterogeneous implementation. Today's synthesis tools and compilers allow us to synthesize or program all the processor-accelerator-memory components once the global system architecture has been defined. However, the availability of these component compilers is necessary, but not sufficient. What is needed are the models and tools to refine the functional specification of a system into the detailed architecture: the definition and allocation of the components and their communication and synchronization. The most essential step is to generate the necessary software and hardware to make processors, accelerators, and the environment communicate.

One of the keys to mastering the complexity of digital system design is the reuse of components. The design process for a digital system must allow the modeling of reusable components and support a design for reuse methodology which allows to design components that are easily reusable. The problem in reusing previously designed components lies in the fixed communication protocols they use, which necessitates protocol conversions when processors with different protocols have to be interfaced. Nowadays, the selection of a protocol is done while designing the component: functional and communication behavior are intrinsically mixed. However, a good selection of the protocol is possible only when all components involved in the communication are known. Therefore, a design environment for digital systems has to allow that a component is initially described in purely functional terms. Later, when the component is (re)used in a system, the design environment must allow to plug in the most appropriate communication behavior. This approach is in contrast with current hardware (VHDL) design practices, where communication and functional behavior are mixed.

Another key to mastering the complexity of digital system design is by means of modularity. In modular designs, the complete system functionality is split into communicating components of manageable complexity. The advantage of this approach is that the components can be reused and that the system is easier to adapt and maintain. The disadvantage is the overhead because of the inter-component communication or because the compiler does not optimize over the component boundaries. Therefore, the inter-component communication semantics should be such that modularity can be removed easily when merging two components into a single component.

In the past, a lot of effort has been put in design environments that allow to implement the components of a digital system. Languages with associated simulators, tuned towards specific application domains, allow to specify and simulate components at a high abstraction level. Hardware compilers can implement the component description into processors with highly specialized architectures. Software compilers permit the generation of machine code for off-the-shelf programmable processors. Instruction set simulators permit the generation of debug the machine code at different levels of abstraction (C, asm). Examples of such design environments are Cathedral-1/2/3, the ARM processor tool suite (C-compiler and the ARMulator), and the Synopsys synthesis tools. From the above it can be concluded that the components of digital systems can be implemented with off-the-shelf design environments. What is missing is the glue that links these design environments together and automatically interfaces the generated or off-the-shelf processors according to the system specification. Hence, a system design environment should allow the easy inclusion of existing design environments. It should provide synthesis tools for hardware/hardware and hardware/software interfacing that are processor and design environment independent. To achieve this, the specification method must allow the modeling of off-the-shelf components on an as-is basis.

In summary, the following requirements can be defined for a hardware/software system design environment.

Modularity being essential to master complexity, but the overhead should be minimal and removable.

Different description languages are needed to allow each system component to be described with the most appropriate paradigm.

The design environment must be able to model the heterogeneous conceptual specification, the resulting heterogeneous architecture and all refinement steps in between.

Off-the-shelf components and the associated design environments need to be modeled.

A clear separation between functional and communication behavior is required to allow to reuse designs.

Processor independent interface synthesis is essential.

SUMMARY OF THE INVENTION

A design methodology and a design environment meeting the above-stated requirements for a hardware/software system co-design environment is disclosed in the present application. A hardware/software co-design environment and design methodology based on a data-model that allows one to specify, simulate, and synthesize heterogeneous hardware/software architectures from a heterogeneous specification is disclosed. The environment and methodology of the present invention are based on the principle of encapsulation of existing hardware and software compilers and allow for the interactive synthesis of hardware/software and hardware/hardware interfaces.

It is a first object of the present invention to disclose a database compiled on a computer environment, adapted for access by executable programs on the environment for generating the implementation of an heterogeneous essentially digital system, comprising a plurality of objects representing aspects of the digital system wherein the objects comprise primitive objects representing the specification of the digital system and hierarchical objects being created by the executable programs while generating the implementation of the digital system, the hierarchical objects being refinements of the primitive objects and having more detail and preserving any one or all of the aspects to thereby generate the implementation of the digital system; relations in between the primitive objects and in between the hierarchical objects and between the primitive objects and the hierarchical objects; and functions for manipulating the objects and the relations.

In an aspect of the present invention, the implementation is a simulation of the digital system. The simulation can be a multi-abstraction level simulation, the multi-abstraction level simulation comprising substantially simultaneous low-level and high-level simulation, or the simulation can be a multi-platform simulation executed on a plurality of computers, or the simulation can be a hybrid simulation comprising substantially simultaneous hardware implementations and computer simulations.

In another aspect of the present invention, the implementation is a heterogeneous implementation comprising hardware subsystems and software subsystems, the software subsystems being executed on one or more of the hardware subsystems. The hardware subsystems comprise any one or more of processor cores, off-the-shelf components, custom components, ASICs, processors, and boards. The software subsystems comprise machine instructions for the hardware subsystems.

In another aspect of the present invention, the specification is a heterogeneous specification comprising a plurality of behavioral and structural languages.

In another aspect of the present invention, the aspects comprise any one or more of functional, communication, concurrency and structural aspects of the digital system. The objects representing the functional aspects comprise any one or more of host language encapsulations, threads, and context. The objects representing the communication aspects comprise any one or more of ports, protocols, channels, and context. The objects representing the concurrency aspects comprise host language encapsulations and threads. The objects representing the structural aspects comprise any one or more of host language encapsulations, ports, channels, and instances. The functional aspects and the communication aspects of the specification are split into first primitive objects representing the functional aspects and second primitive objects representing the communication aspects. The first primitive objects are host language encapsulations and the second primitive objects comprise ports, protocols, and channels, where one port has one protocol. The ports are connected by channels, the communication between the ports over the channels is conducted according to remote-procedure-call semantics. The second primitive objects are refined into second hierarchical objects for adding implementation detail to the communication behavior of the second primitive objects. The concurrency aspects are inter-process concurrency aspects and intra-process concurrency aspects. The communication aspects are intra-process communication aspects, inter-process communication aspects with remote-procedure-call semantics, and inter-process communication aspects with a hierarchical protocol. The intra-process communication occurs between threads of a single process by shared variables in the context. The inter-process communication with remote-procedure-call semantics occurs between a slave thread of a first process and a thread of a second process according to remote-procedure-call semantics, wherein the database includes process merging functionality whereby the inter-process communication with remote-procedure-call semantics between a plurality of processes is removed by merging the plurality of processes. The inter-process communication with a hierarchical protocol occurs between a thread of a first process and a thread of a second process according to the semantics of the hierarchical protocol.

It is another object of the present invention to disclose a design environment, compiled on a computer environment, for implementing an heterogeneous essentially digital system, comprising a database compiled on the computer, adapted for access by executable programs on the computer for generating the implementation of the heterogeneous essentially digital system, comprising a plurality of objects representing aspects of the digital system wherein the objects comprise primitive objects representing the specification of the digital system and hierarchical objects being created by the executable programs while generating the implementation of the digital system, the hierarchical objects being refinements of the primitive objects, having more detail and preserving any one or all of the aspects to thereby generate the implementation of the digital system; and further comprising relations in between the primitive objects and in between the hierarchical objects and between the primitive objects and the hierarchical objects; and further comprising functions for manipulating the objects and the relations; means for specifying the heterogeneous digital system comprising a plurality of behavioral and structural languages; means for simulating the heterogeneous digital system comprising a plurality of simulators for the behavioral and structural languages; means for implementing the heterogeneous digital system comprising a plurality of compilers for the behavioral and structural languages; means for allocating hardware components for an implementation of the heterogeneous digital system; means for assigning hardware subsystems and software subsystems of the heterogeneous digital system to the hardware components; means for implementing the communication between the software subsystems and the hardware subsystems, one of the aspects of the communication being represented by ports; and means for encapsulating the simulators, the compilers, the hardware components, the hardware subsystems and the software subsystems, thereby creating a consistent communication between the encapsulated simulators, compilers, hardware components, hardware subsystems and software subsystems.

In an aspect of the present invention, the design environment further includes means for creating processor models of the hardware components as objects in the database, the models comprising software models representing the software views on the hardware components and hardware models representing the hardware views on the hardware components. The design environment further includes means for creating I/O scenario models of the ports as objects in the database, the I/O scenario models representing the implementation of the ports on the hardware components, the implementation comprising software subsystems, hardware subsystems, and processor models with connections therebetween. The implementation of the communication between a first software subsystem and a first hardware subsystem results in the first software subsystem with a first port being replaced by a second hardware subsystem with a second port, where the first port and the second port represent an essentially identical communication. The design environment further comprises means for selecting I/O scenario models for the ports of the first software subsystem; means for combining the software subsystems of the selected I/O scenarios; and means for combining the hardware subsystems of the selected I/O scenarios. A first I/O scenario model represents the connection of the first port to the second port, the connection comprising a connection of the first port to the software subsystems of the I/O scenario model, connections of the software subsystems of the I/O scenario model to the software model, connections of the hardware model to the hardware subsystems of the I/O scenario model, and a connection of the hardware subsystems of the I/O scenario model to the second port. The I/O scenario models comprise any one or more of memory mapped I/O scenarios, instruction programmed I/O scenarios, and interrupt based I/O scenarios.

It is another object of the present invention to disclose a method of specifying an heterogeneous essentially digital system, the specification having hardware and software aspects, comprising the steps of describing the system in a plurality of processes, each process representing a functional aspect of the system; defining ports and connecting the ports with channels, the ports structuring communication between the processes; and defining communication semantics of the ports by a protocol.

It is yet another object of the present invention to disclose a method of exploring an heterogeneous essentially digital system, the specification having hardware and software aspects, comprising the steps of describing the specification of the system in a plurality of processes, each process representing a functional aspect of the system; defining ports and connecting the ports with channels, the ports structuring communication between the processes; defining communication semantics of the ports by a protocol; allocating one or more hardware components; and assigning the processes to the hardware components, thereby partitioning the system.

In an aspect of the present invention, the method further includes the step of repeating the definition, allocation and assignment steps until an optimal partitioning of the specification of the system is obtained.

It is still yet another object of the present invention to disclose a method of making an implementation of an heterogeneous essentially digital system, comprising the steps of defining a first set of primitive objects representing the specification of the digital system, which comprises the steps of describing the specification of the system in one or more processes, each process representing a functional aspect of the system, where the process are primitive objects; defining ports and connecting the ports with channels, the ports structuring communication between the processes, where the ports and the channels are primitive objects and one process has one or more ports; defining communication semantics of the ports by a protocol, where the protocol is a primitive object. The method thereafter creates hierarchical objects that are refinements of the primitive objects and have more detail, while preserving aspects of the communication semantics.

In an aspect of the present invention, the method further comprises the step of simulating the system.

In another aspect of the present invention, the implementation comprises hardware and software subsystems of the system, where the software subsystems are executed on one or more of the hardware subsystems. The method further comprises the step of generating a net list comprising the layout information of the implementation. The hardware subsystems include any one or more of processor cores, off-the-shelf components, custom components, ASICs, processors, and boards.

In yet another aspect of the present invention, the method further comprises the steps of allocating one or more hardware components, the components comprising programmable processors and non-programmable processors; and assigning the processes to the hardware components, where the processes assigned to a programmable processor are a software subsystem, and the other processes are hardware subsystems. The method further comprises the step of selecting I/O scenario models for the ports of the software subsystem thereby connecting the ports to the interface of the programmable processor and connecting the interface of the programmable processor to second ports, where the second ports represent an essentially identical communication as the ports. The method further comprises the step of refining the channel in between a first and a second port of respectively a first and a second hardware component, where the first and the second port has an incompatible protocol, thereby creating a hierarchical channel, where the hierarchical channel converts the first protocol into the second protocol. The method further comprises the step of generating a net list comprising the layout information of the implementation. The hardware subsystems include any one or more of processor cores, off-the-shelf components, custom components, ASICs, processors, and boards. The method further comprises the step of refining the channels in between incompatible ports of hardware components, thereby creating hierarchical channels.

DETAILED DESCRIPTION OF THE PREFERRED EMBODIMENTS

A design environment and a design methodology meeting the requirements of modularity, encapsulation of different description languages, modeling from a heterogeneous conceptual specification to a resulting heterogeneous architecture and all refinement steps in between, modeling capabilities for off-the-shelf components and the associated design environments, separation between functional and communication behavior and processor independent interface synthesis is disclosed hereinbelow. This design environment is called CoWare.

It is to be understood that the term concept refinement means converting or translating or transforming a specification of an electronic system into an implementation. This implementation can be an architecture of components that has the same behavior as the specification or that executes the specification. The implementation can also be an added development in the chain leading to a final implementation. Adding detail means that an implementation is made more specific or concrete as a result of an implementation decision on a previous level in the chain leading to a final implementation. To detail can also mean adding a material object such as a specific component or a specific communication in between components, as opposed to an abstract aspect on a previous level in the chain leading to a final implementation. Other instances of the concept refinement and of the concept detail are to be found hereinbelow.

Figure 1:
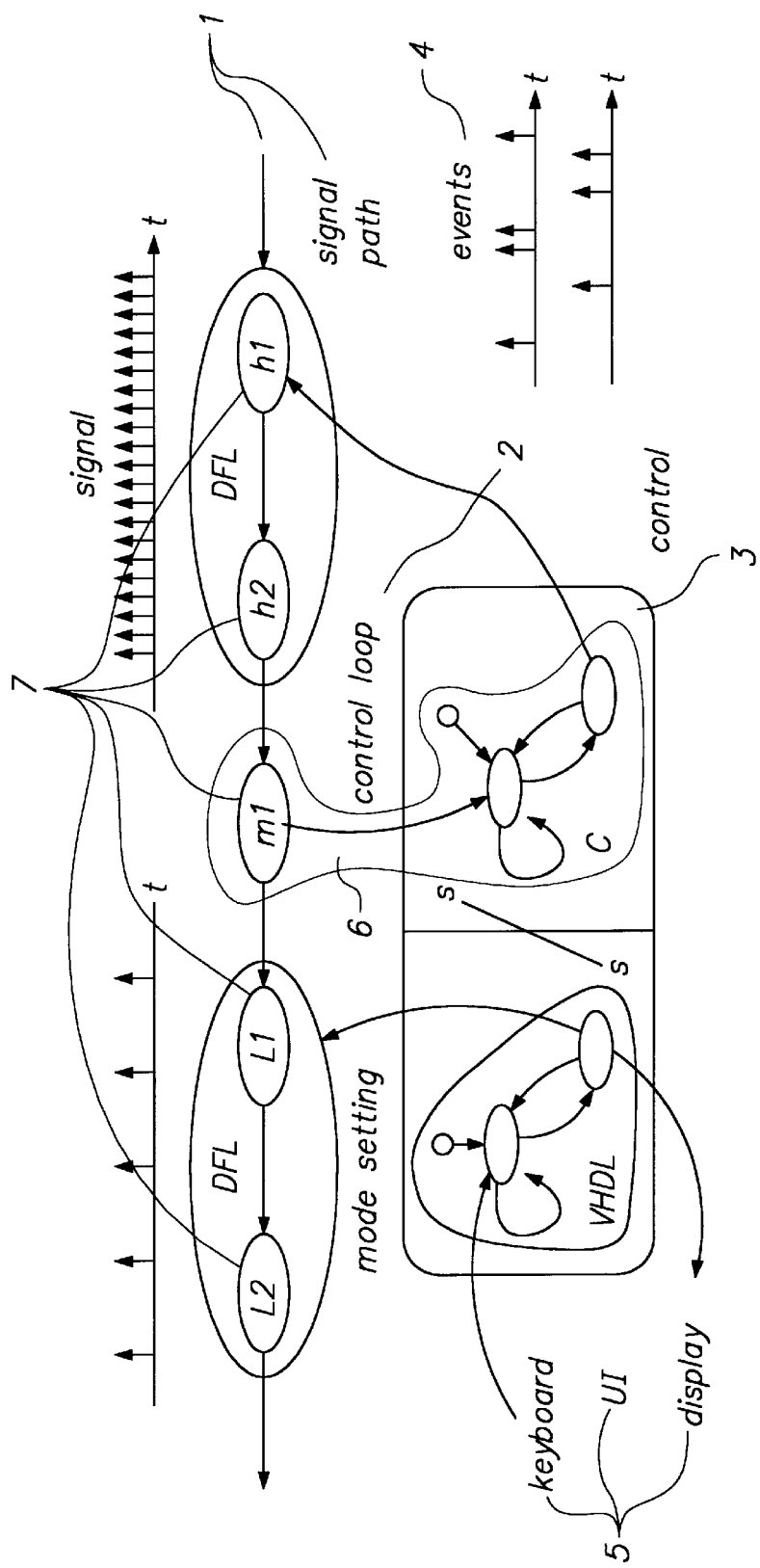
FIG. 1 is a schematic representation of a heterogeneous digital system comprising various specification paradigms, which is the system to be designed using the hardware/software technique of the present invention.
Figure 2:
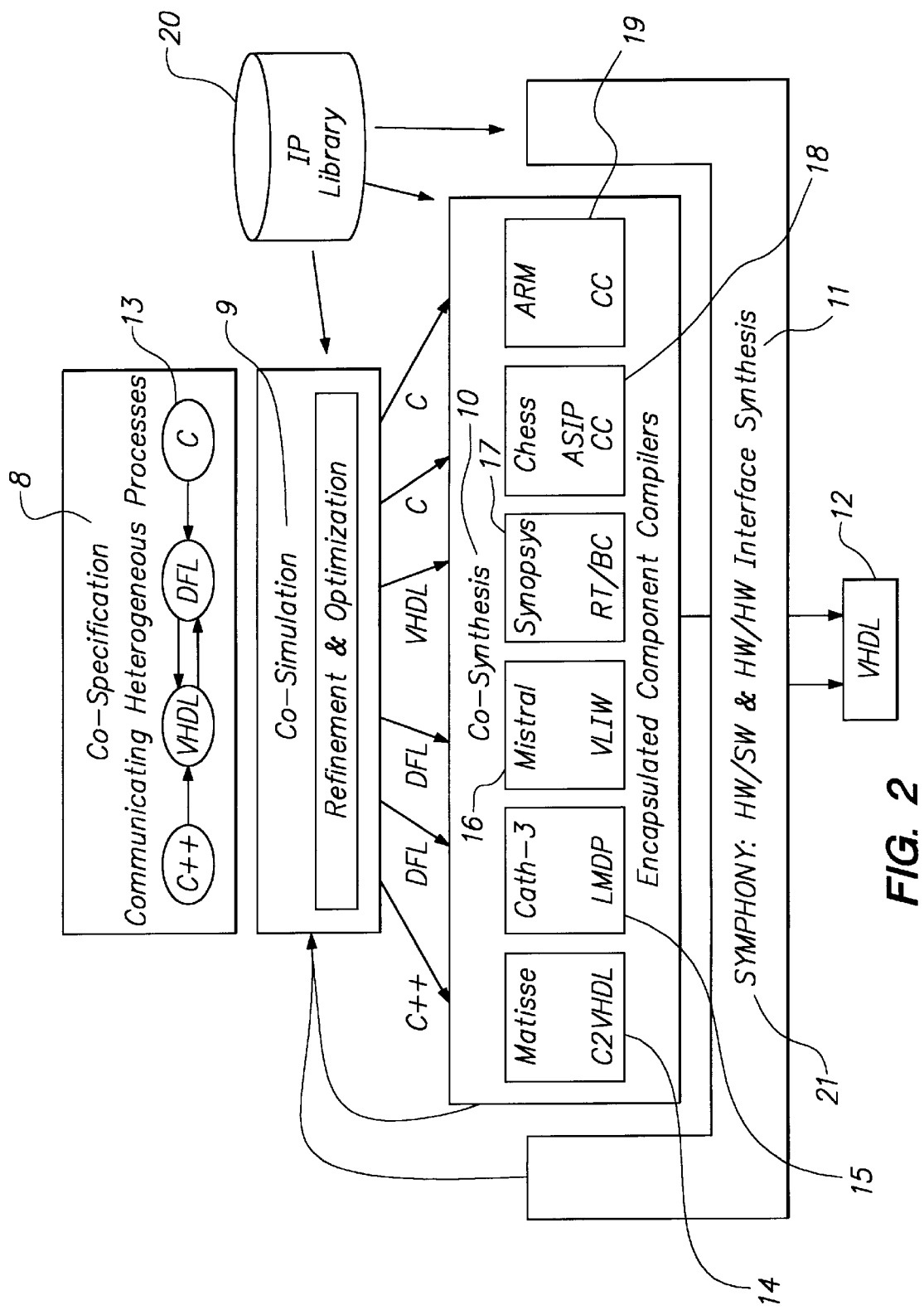
FIG. 2 is a flowchart representing the method for hardware/software co-design of the present invention.

FIG. 2 shows the architecture of the CoWare system. The CoWare system supports four major design activities: co-specification 8, co-simulation 9, co-synthesis 10 and interface synthesis 11. The input is a heterogeneous specification of an electronic system, the output 12 may include a net list for prior-art commercial tools for the generation of the implementation layout. This output preferably comprises structural VHDL or Verilog and machine code for the programmable processors.

The CoWare design environment is implemented on top of a data model in which modularity is provided by means of processes. Processes contain host language encapsulations which are used to describe the system components. Communication between processes takes place through a behavioral interface comprising ports. For two processes to be able to communicate, their ports must be connected with a channel. The inter-process communication semantics is based on the concept of the Remote Procedure Call (RPC). The data model is hierarchically structured and allows the refinement of channels, ports, and protocols into lower level objects, and add detail. The most abstract object is referred to as a primitive object. An object that contains more implementation detail than a primitive object is referred to as a hierarchical object.

We first discuss the primitive objects. The hierarchical objects are used to refine the communication behavior of the system and are discussed afterwards.

A process is a container for a number of host language encapsulations of a component. A single process can have multiple host language encapsulations describing different implementations for the same component, or for the same component represented at different abstraction levels.

A host language encapsulation describes a component in a specific host language. Preferably C, C++, DFL, VHDL and Verilog are supported host languages. A CoWare language encapsulation is used to describe the system's structure. In a CoWare language encapsulation, one can instantiate processes and connect their ports with channels. Other host language encapsulations comprise context and a number of threads. The context and thread contain code written in the host language of the encapsulation. The context contains code that is common to all threads in the encapsulation, i.e., variables/signals and functions as allowed by the semantics of the host language. As such, the context provides for inter-thread (intra-process) communication.

Each primitive CoWare process (symbolized by an ellipse 13 in FIG. 2) encapsulates concurrent program threads in a host language of choice. Concurrent threads communicate over shared memory inside a process. Inter-process communication is over uni-directional channels using a Remote Procedural Call (RPC) protocol. The reasons of this choice will be explained below. Notice that in this way heterogeneous specification is supported: both hardware and software aspects, structural and behavioral aspects, and different specification paradigms (data-flow, control-flow, and so forth) can be combined.

Co-specification allows to describe a functional specification based on the concept of communicating CoWare processes.

An important concept of CoWare is that basically no distinction is made between co-simulation and co-synthesis. Both are based on the concept of refining the specification for implementation, re-using existing compilers, emulators, and simulation processes.

In refinement for co-synthesis the designer performs an interactive coarse partitioning of the specifications over a user allocated architecture. This leads to a merger of component compiler consistent processes to be mapped on the same component. Component compiler consistent processes have an encapsulation in the same host language. Merging consists of in-lining the RPC calls between the processes and leads to two subproblems: the mapping of the concurrent threads in the processes on a processor re-using existing component compilers 14, 15, 16, 17, 18, 19 and the refinement of the communication between processes into hardware and software communication protocols that implement it. The implementation of concurrent threads and intra-process communication must be taken care of by using Real-Time Operating Systems (RTOS), micro-kernels or software synthesis in case of programmable processors or by providing a library based communication protocol shell around the existing hardware synthesis tools. Refinement of the inter-process communication means again a refinement of the primitive RPC communication by expanding the communication ports into implementable protocols available in a protocol library 20. It is also possible to assign channel processes to abstract channels.

In principle all of this is open to the user who can add his own library for communication protocols. On the other hand, CoWare provides in the SYMPHONY toolbox 21 a methodology for interface synthesis whereby every communication channel is refined by selection of a communication scenario. In this way, automated synthesis of hardware/hardware and hardware/software interfaces, including the generation of the software drivers in programmable processors is possible. This is an essential part of hardware/software co-design.

After the compilation of all components, all hardware is available as structural VHDL and all software for the processors is in C which can be compiled on the host compiler of the programmable components. The final step is to link all the synthesis and hardware descriptions to drive commercial back-end tools to generate layout.

Figure 3:
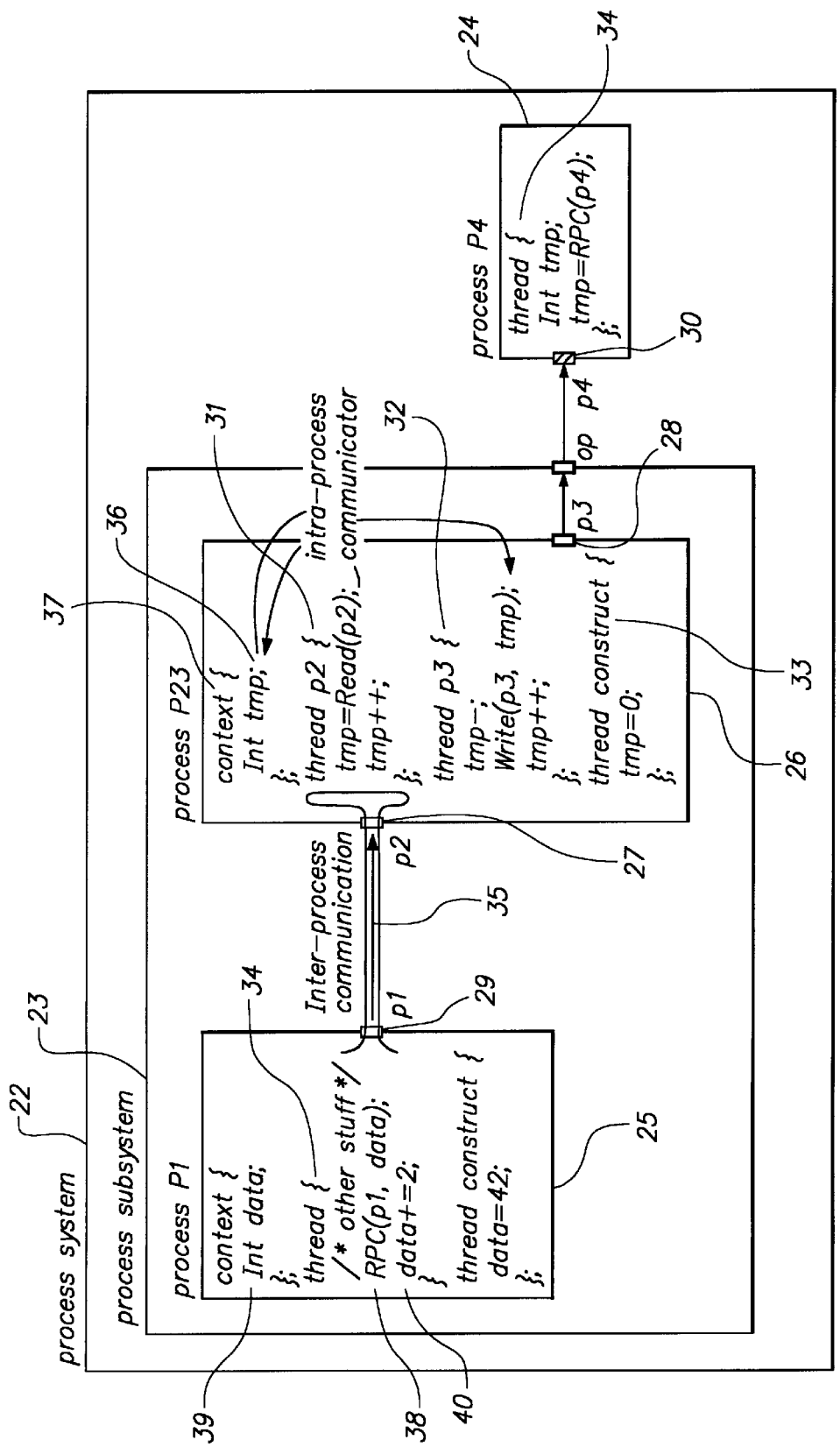
FIG. 3 is an illustration of exemplary primitive objects in a co-design database and the relations in between the primitive objects.

In FIG. 3, the processes system 22 and subsystem 23 contain a CoWare language encapsulation. The CoWare language encapsulation of system 22 describes how it is built up from an instance of subsystem 23 and an instance of process P4 (24). The processes P1 (25),P23 (26), and P4 (24) each contain a C language encapsulation.

Ports are objects through which processes communicate. A primitive port is characterized by a protocol and a data type parameter. There is one implicit port, the construct port, to which an RPC is performed exactly once at system start-up.

In FIG. 3, the process P23 (26) has two primitive ports p2 (27)and p3 (28), next to the implicit construct port.

Protocols define the communication semantics of a port. A primitive protocol is one of master, in master, out master, inout master, slave, inslave, outslave, inoutslave. Each primitive protocol indicates another way of data transport.

The in, out, and inout prefix indicates the direction of the data. The master, slave postfix indicates the direction of the control: whether the protocol activates an RPC (master) or services an RPC (slave). In the remainder of this text, ports with a slave/master protocol are usually referred to as slave/master ports.

In FIG. 3 master ports (29, 30) are represented by the small shaded rectangles on a process' perimeter. Slave ports (27, 28) are represented by small open rectangles on the perimeter. The data direction of a port is represented by the arrow that connects to a port. In FIG. 3 port p1 (29) is an outmaster port and port p2 (27) is an inslave port.

A protocol may further have an index set. The indices in the index set are used to convey extra information about the data that is transported. For example the primitive protocol used to model the memory port of a processor will have an index to model the address of the data that is put on the memory port.

A thread is a single flow of control within a process. A thread contains code in the host language of the encapsulation of which the thread is a part. The code in a thread is executed according to the semantics of the host language. We distinguish between slave threads and autonomous threads.

Slave threads are uniquely associated to slave ports and their code is executed when the slave port is activated (i.e. when an RPC is performed to the slave port). There is one special slave thread which is associated to the implicit construct port and can be used to initialize the process.

In FIG. 3 the process P23 (26) contains two regular slave threads (31, 32) associated to the slave ports p2 (27) and p3 (28) respectively, next to the special construct slave thread (33).

Autonomous threads are not associated to any port and their code is executed, after system initialization, in an infinite loop. In FIG. 3 processes P1 (25) and P4 (24) each contain an autonomous thread (34).

A language encapsulation can contain multiple slave and autonomous threads that, in principle, all execute concurrently.

A channel is a point-to-point connection of a master port and a slave port. Two ports that are connected by a channel can exchange data. Channels can be uni- or bi-directional. A primitive channel provides for unbuffered communication. It has no behavior: it is a medium for data transport. In hardware it is implemented with wires. In software it is implemented with a (possibly in-lined) function call. In this way, primitive channels model the basic communication primitives found back in software and hardware description languages.

In the strict sense only point-to-point channels connecting one master to one slave port are allowed. However, a person skilled in the art, can easily remove this restriction to allow channels connecting two master ports or two slave ports, or to allow channels connecting multiple slave and master ports. Such an extended description, can be transformed into the basic model, by using a default or user-defined translation scheme.

In FIG. 3, there is a primitive channel (35) that connects port p1 (29) of process P1 (25) with port p2 (27) of process P23 (26).

Communication always happens between two threads. Communication between threads that are part of the same process is denoted as intra-process communication. Communication between threads in different processes is denoted as inter-process communication.

Intra-process (inter-thread) communication is done by making use of shared variables/signals that are declared in the context of the process. Avoiding that two threads access the same variable at the same time is host language dependent. It is the user's responsibility to protect critical sections using the mechanisms provided in the host language.

In FIG. 3, intra-process communication occurs in process P23 (26).The variable tmp (36) declared in the context (37) is shared by slave thread p2 (31) and slave thread p3 (32).

Inter-process (inter-thread) communication with a primitive protocol is RPC based. On a master port, the RPC function can be used to initiate a thread in a remote process. A master port can be accessed from anywhere in the host language encapsulation (context, autonomous threads, slave threads) with the exception of the construct thread. The RPC function returns when the slave thread has completed, i.e. when all the statements in the slave thread's code are executed. In the slave thread (uniquely associated with a slave port), the Read and Write functions can be used to access the data of the slave port. The Index function is used to access the indices of the protocol of the port. The RW bar function is used on an inoutslave port to determine the actual direction of the data transport. A slave port can only be accessed from within its associated slave thread.

A bi-directional port can be used to both send and receive data. However, according to the strict RPC semantics this cannot be done by the same RPC call. In a single RPC call, one uses the bidirectional port either in the input or in the output direction but not in both directions. For a person skilled in the art, it is easy to extend the strict RPC semantics to full fledged function call semantics where arguments are passed to a remote procedure and results are received back.

In FIG. 3, inter-process communication occurs between processes P1 (25) and P23 (26) over the channel (35). When the RPC statement(38)in the autonomous thread (34) is reached, the value of the local variable data (39) is put on the channel (35), and the control is transferred to the slave thread p2 (31). The autonomous thread (34) is halted, until the last statement of the slave thread(31) is executed. After that the autonomous thread (34) resumes by executing the statement (40) after the RPC statement (38).

By using primitive channels, ports, and protocols, the designer first concentrates on the functionality of the system while abstracting from terminals, signals, and handshakes. Once the designer is convinced that the processes of the system are functionally correct, the communication behavior of the system can be refined. Communication refinement in CoWare is carried out by making the objects involved in the communication (channels,ports, and protocols) hierarchical.

Hierarchical channels are processes that assign a given communication behavior to a primitive channel. The behavioral interface of a hierarchical channel is fixed by the ports connected by the primitive channel. Making a channel hierarchical, can drastically change the communication behavior of two connected processes. It can, for example, parallelize (pipeline) the processes by adding buffers. The one property that is preserved by making a channel hierarchical is the direction of the data transport.

Figure 4:
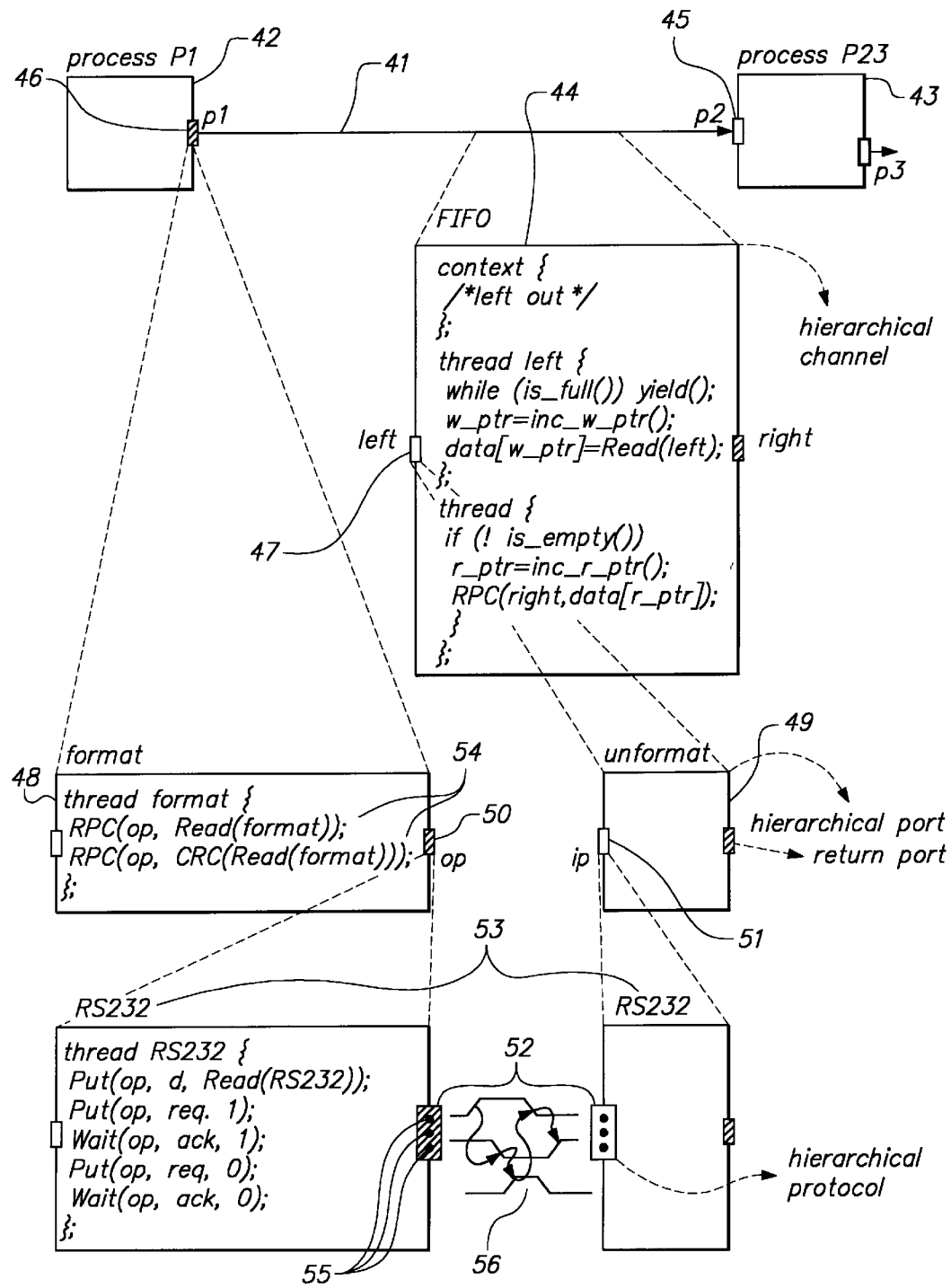
FIG. 4 is an illustration of the exemplary hierarchical objects in the database and the relations in between the hierarchical objects and between the primitive objects shown in FIG. 3 and the hierarchical objects.

In FIG. 4, the primitive channel (41) between processes P1 (42)and P23 (43) is refined into a hierarchical channel (44) with FIFO behavior. The FIFO hierarchical channel (44) decouples the autonomous thread of process P1 (42) and the slave thread associated with port p2 (45) of process P2 (43). The effect is that the rate at which process P1 (42) can issue RPCs is no longer determined by the rate at which process P23 (43) can service the RPCs. The FIFO hierarchical channel (44) takes care of the necessary buffering of data.

Hierarchical ports are processes that assign a given communication behavior to a primitive port. The behavioral interface of the hierarchical port is partially fixed by the primitive port it refines. The hierarchical port process should have one port, which we call the return port, that is compatible with the primitive port. Making a primitive port hierarchical, preserves the data direction (in/out). Two ports are compatible if their primitive protocols are compatible, if they have equal data type, and if they have equal protocol indices. The following primitive protocols are compatible: (master, slave); (inslave, outmaster); (inslave, inoutmaster); (outslave, inmaster); (outslave, inoutmaster); (inoutslave, inmaster); (inoutslave, outmaster); (inoutslave, inoutmaster). Two hierarchical protocols are compatible if their primitive protocols are compatible and they have the same name.

In FIG. 4 we impose a certain data formatting for the data transported over the channel (41) between process P1 (42) and the FIFO hierarchical channel (44). This is achieved by making the primitive ports p1 (46) and left (47) hierarchical. The format process (48) that refines port p1 (46) might for example add acyclic redundancy check to the data that is transported. The unformat process (49) that refines port left (47) of the FIFO hierarchical channel (44) then uses this cyclic redundancy check to determine whether the received data is valid. The actual data and the cyclic redundancy check are sent sequentially over the same primitive channel between ports op (50) and ip (51). As a consequence, the data rate between the format (48) and unformat (49)process is twice the one of process P1 (42).

Primitive protocols provide a classification of all hierarchical protocols. A primitive protocol determines the communication semantics, but not the communication implementation: it does not fix the timing diagram used in the communication. Hierarchical protocols refine primitive protocols with a timing diagram and the associated I/O terminals. Hierarchical protocols are high level models for alternative implementations of a primitive protocol: they preserve both data direction and control direction of the primitive protocol.

To access the terminals of the hierarchical protocol, a hierarchical port is introduced at the same time. The terminals can be accessed from within the thread code by using the functions Put, Sample, and Wait.

In FIG. 4, the primitive protocol of the port (50) and ip port(51) of the format (48) and unformat (49) process are refined into an RS232 protocol (52). In the RS232 hierarchical port (53), an RPC (54) issued in the format process (48) on the op port (50) is converted into manipulations of the terminals (55) according to a timing diagram (56).

The CoWare model is implemented on a computer or on a plurality of computers and a set of application programmer's interface (API) functions is available. When a CoWare system description is parsed, a representation of the system in memory is created in which the objects of the description are related to each other. All tools of the CoWare environment use these API functions to analyze, manipulate, and refine the system description.

In a preferred embodiment, the tools are executed on a Hewlett Packard 715/50 workstation, a SUN, a DEC or other commercially available workstation, or a personal computer or another computer. Different tools can run on different workstations that are interconnected over a network.

Due to the selection of RPC as inter-process communication, the classification of protocols and the structuring of a process in encapsulations with context and threads, a process merge transformation can be implemented.

The goal of this transformation is to combine a number of process instances, that are described in the same host language, into a single host language encapsulation that can then be mapped by a host language compiler onto a single processor.

In the process of merging, all remote procedure calls are in-lined: each slave thread is in-lined in the code of the thread that calls it through an RPC statement. Because of the semantics of RPC communication, this transformation does not alter the behavior of the original system, provided that care is taken to avoid name clashes. The result of merging is a single host language encapsulation that contains a single context, a single construct thread, one or more autonomous threads, possibly multiple slave threads to service RPC requests from external process (not involved in the process merge transformation), possibly multiple RPCs to slave threads in external processes (not involved in the process merge transformation).

Figure 5:
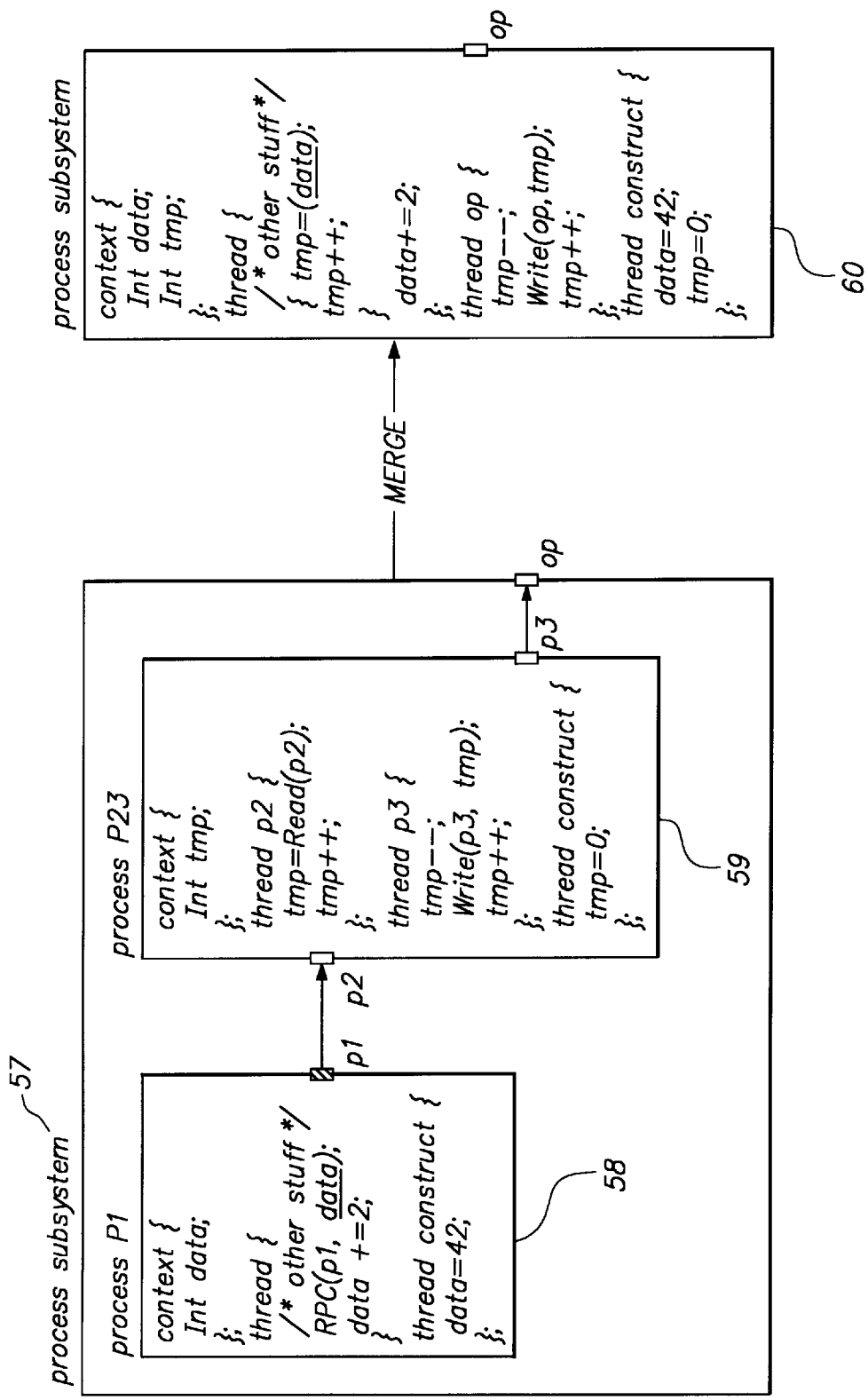
FIG. 5 is an illustration of the process merge transformation of the exemplary primitive objects shown in FIG. 3.

FIG. 5 shows the effect of merging the process instances (25,26) in the subsystem process (23) of FIG. 3. The subsystem process (57) has a CoWare language encapsulation. After merging the instances (58, 59), we obtain a C language encapsulation (60) which is added to the subsystem process.

The benefit of merging processes is that the in-lining transformation eliminates the overhead that accompanies execution of (remote) procedure calls. It further reduces the number of concurrent threads and, therefore, the overhead that accompanies the switching between threads. Finally, it allows the host language compilers to optimize over the boundaries of the original processes.

The port and protocol hierarchy provides a clear separation between functional and communication behavior. Traditionally, the description of a component contains both functional and communication behavior in an interleaved way. When such a component has to be re-used, in an environment other than it was intended for, the designer has to change those parts of the description of the component that have to do with communication. In CoWare, a component's behavior is described by a process that makes use of RPC to communicate with the outside world. Such processes can be connected with each other without modifying their description (modularity). By using primitive ports and primitive protocols, the designer concentrates on the functionality of the system while abstracting from terminals, signals, and handshakes. Later, when the component is instantiated in a system, the primitive protocol is refined into the best suited hierarchical protocol, taking into account the other system components involved. This fixes the timing diagram and terminals used to communicate over that port. The port containing the hierarchical protocol, is made hierarchical to add the required communication behavior that implements the timing diagram of the selected hierarchical protocol. Again this is achieved without modifying the description of any of the processes involved. Because of this property it is feasible to construct libraries of functional building blocks and libraries of communication blocks that are re-usable: they can be plugged together without modifying their description. After blocks have been plugged together, any communication overhead (chains of remote procedure calls) can be removed by in-lining the slave threads that serve the RPCs. The result is a description of the component in which function and communication are interleaved seamlessly and which can be compiled into software or hardware as efficiently as a description in the traditional design process.

The above method reduces the amount of protocol conversions needed at the system level and allows to postpone the selection of the communication protocol and its implementation until late in the design process, in this way achieving the requirements of "design for re-use". The concept of hierarchical protocols is also useful to model off-the-shelf components ("re-use of designs"), because the timing diagrams according to which a processor communicates are abstracted in it.

The input to the implementation refinement process is a functional specification: a CoWare language encapsulation consisting of a number of process instances (i.e. host language encapsulations), exhibiting both intra-process and inter-process communication behavior. In a first step, allocation is performed. In this step the number and type of processors are selected that will serve as the target for implementing the input specification. After allocating the necessary processor resources, an assignment step is performed. In this step each process instance of the input specification is assigned to one of the allocated processors.

Figure 6:
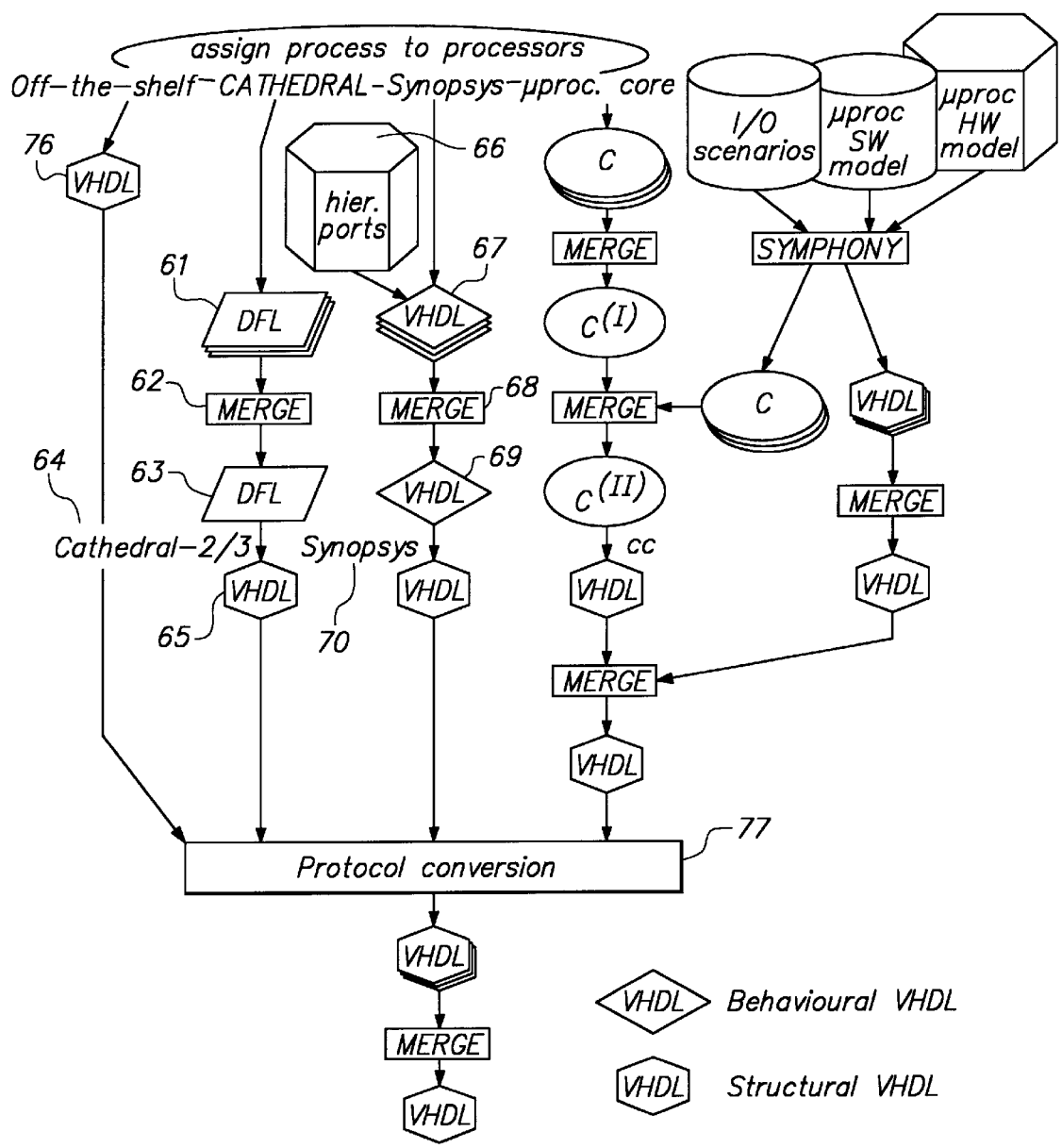
FIG. 6 is a flowchart of a specific embodiment of the implementation process for hardware/software co-design according to the method of FIG. 2.

The rest of the implementation path is illustrated in FIG. 6. All process instances bound to a single processor are merged. This results in a system with a one-to-one mapping between (merged) processes and allocated processors. In FIG. 6, all DFL processes (61) are merged (62) into a single DFL process (63).

The host language encapsulation from each (merged) process instance now has to be compiled onto its processor target using a host language compiler. This comprises the following steps:

(1) The CoWare concepts of autonomous thread, slave thread, and shared context are implemented on the processor target.

(2) The inter-process communication is implemented.

(3) The resulting processors are encapsulated so that they can be connected with the rest of the system.

In step (1) existing (commercial) host language compilers are re-used. When such a host language compiler does not directly support the CoWare concepts of autonomous thread, slave thread, and shared context, the CoWare environment supports two alternatives:

the host language compiler is extended with libraries that support such concepts (multi-thread library);

software synthesis is performed to translate the host language encapsulation to a description that can be handled by the host language compiler.

In FIG. 6, the DFL process (63) is compiled with the Cathedral compiler (64). The result is a VHDL net list (65) of the implementation.

In step (2) when the process is compiled on a non-programmable processor, the implementation of inter-process communication comprises the steps of refining the primitive ports/protocols into appropriate hierarchical ports/protocols and merging the hierarchical ports with the process.

In FIG. 6, hierarchical ports (66) are added to the VHDL processes (67). After merging (68) all processes (67), the resulting VHDL process (69) is compiled with the Synopsys compiler (70).

In step (2) when the process is compiled on a programmable processor, the implementation of inter-process communication comprises the steps of generating device drivers and of generating hardware interfaces. A software tool is used to achieve this. This tool is called SYMPHONY hereinbelow.

Figure 7:
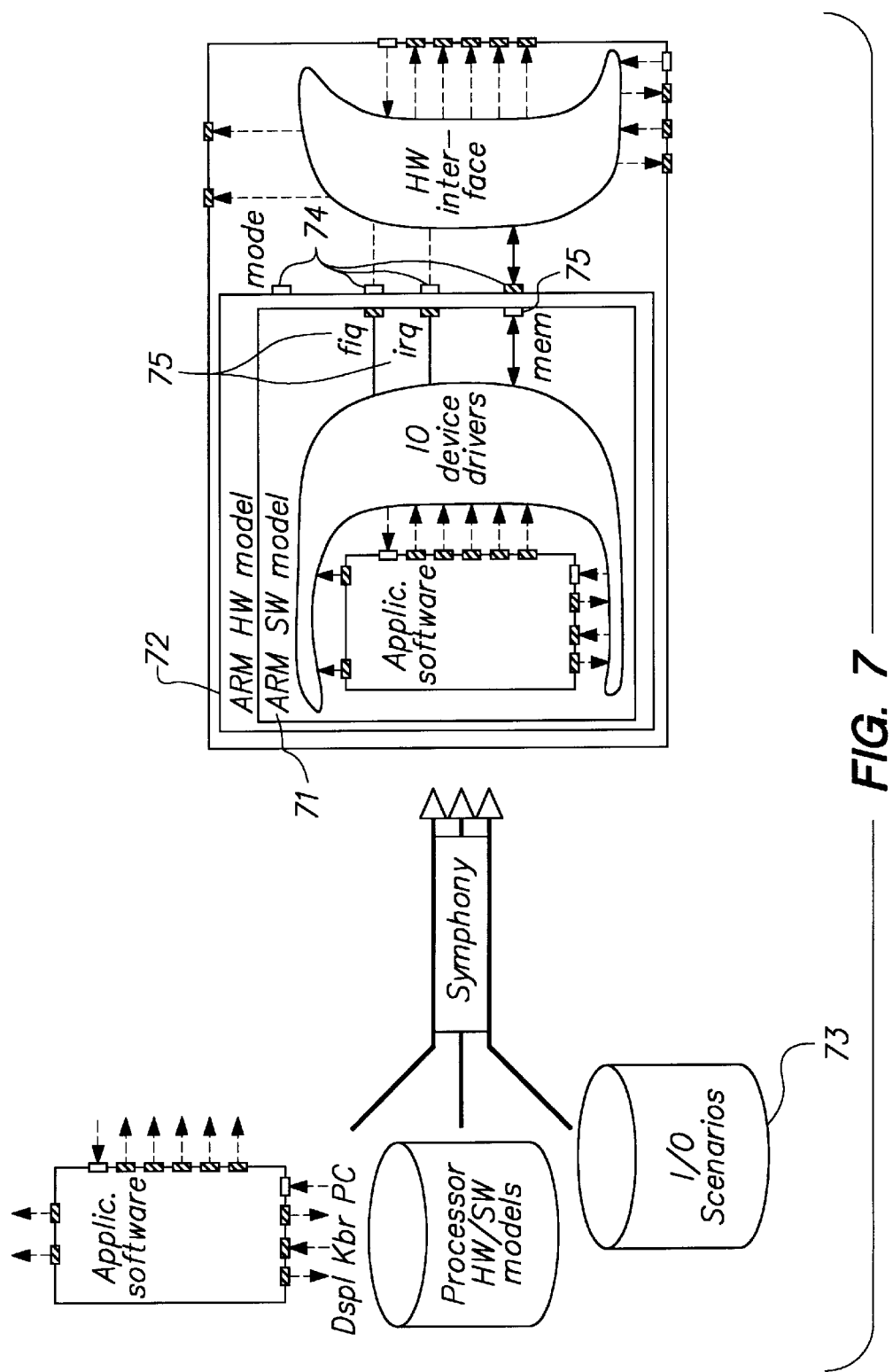
FIG. 7 is a schematic representation of the functionality of the hardware/software interface generation for the implementation process shown in FIG. 6.

FIG. 7 illustrates the tool SYMPHONY. SYMPHONY makes use of a software model (71) and hardware model (72) of the target processor and a library of I/O scenarios (73) for that processor. The hardware model (72) of the programmable processor core consists of a HDL host-language encapsulation that formalizes the information that is available in the hardware section of the data sheet of the programmable processor core. The HDL host-language encapsulation of the hardware model is characterized by a behavioral interface that conforms with the hardware interface of the programmable processor. All hardware ports (74) have hierarchical protocols: they consist of terminals and a timing diagram. The hardware model may also contain a HDL description for either a black box, a simulation model, or the full description of the processor core.

The software model (71) of the programmable processor core consists of a software host-language encapsulation that formalizes the information that is available in the software section of the data sheet of the programmable processor. The software host-language encapsulation of the software model is characterized by a behavioral interface that conforms with the software interface of the programmable processor core. All software ports (75) have primitive protocols. The software model identifies, for example, what ports can be used to get data in or out of the processor core (memory mapped, co-processor port, . . . ), what ports can be used as interrupt ports and what their characteristics are (interrupt priority, maskable interrupt, . . . ). In addition, the software model contains a behavioral description that allows compilation of a software host language encapsulation into machine code. For example: functions to manage processor specific actions such as installing an interrupt vector, enabling/disabling interrupts, etc.

In FIG. 7, the software model of the ARM-6 RISC processor is shown along with a number of its ports (75). The memory port mem is modeled as a (bi-directional) slave port. This slave port is accessed by the device drivers, by means of an RPC, to write/read data to/from the external hardware. The slave thread, modeled in the software model, attached to the mem slave port translates the incoming RPC to a memory access. SYMPHONY makes the connection between the device drivers and the mem port. The fiq port, an interrupt port on a programmable processor, is modeled as a master port. The software model of the ARM processor ensures that an RPC to this port is performed every time the processor detects that an interrupt has occurred. SYMPHONY connects the fiq port to a slave thread that serves as the interrupt service routine so that routine is started automatically.

In FIG. 7, the hardware model of the ARM-6 RISC processor is shown along with a number of its ports (74). The memory port mem is modeled as a (bi-directional) master port. The hardware model of the ARM- performs an RPC to port every time that it wants to write/read data from the RAM, ROM or memory mapped hardware. SYMPHONY connects the mem port to a slave thread in the hardware interface, which does the address decoding and forwards the RPC to the appropriate hardware block (RAM, ROM, memory mapped hardware).

The fiq port is modeled as a slave port in the hardware model. This slave port is activated by an RPC that is performed to the port by the hardware interface. The slave thread attached to the fiq port (and modelled in the hardware model) sets the appropriate flag in the status register to the appropriate value, signalling the interrupt request.

The link between events (RPC to ports, starting of slave threads attached to slave ports) in the hardware model and events in the software model, is handled by the processor hardware or, in the case of simulation, by the instruction-set simulator for the ARM.

Figure 8:
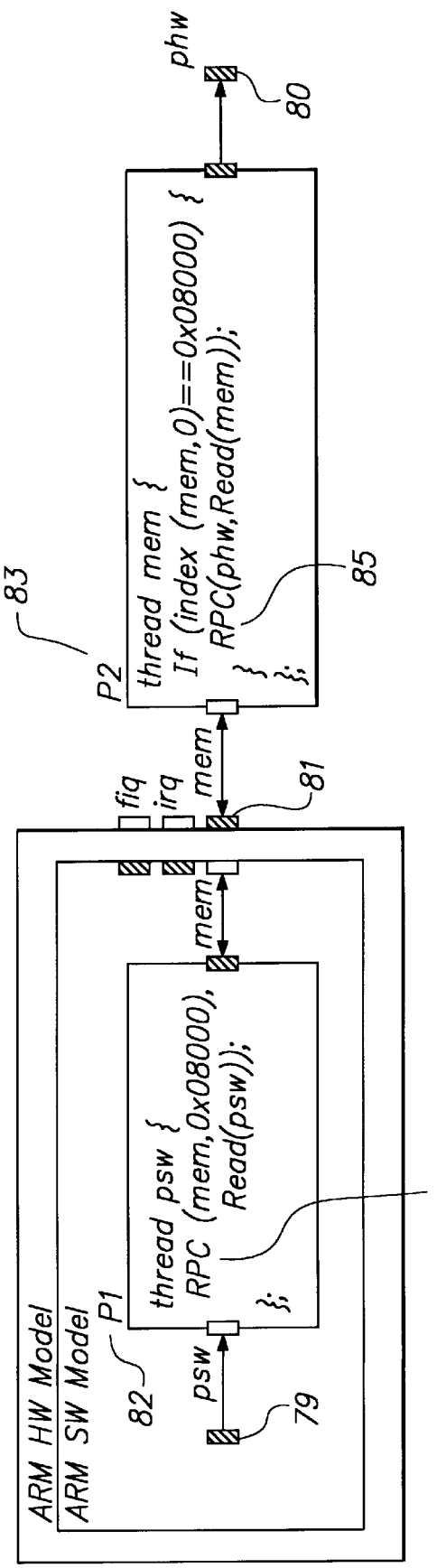
FIG. 8 is a schematic representation of a particular I/O scenario modeled in the database according to the generation process shown in FIG. 7.

SYMPHONY is based on the observation that programmable processor share a number of common communication methods to get data in or out of the processors. These communication methods are modeled by I/O scenarios. An I/O scenario describes one way of using the ports of a specific processor core to map a particular port of a software host language encapsulation to an equivalent port in hardware, thereby crossing the processor core boundary while maintaining the communication semantics. FIG. 8 shows an example of an I/O scenario. It consists of a software host-language encapsulation and a hardware host-language encapsulation that describe a software I/O driver and the hardware counterpart, respectively. An I/O scenario is also tagged with some performance figures that will allow the designer or SYMPHONY to make a decision about what I/O scenario to use for which port. The I/O scenario (78) of FIG. 8 shows how an outmaster port psw (79) in software can be mapped to an outmaster port phw (80) in hardware, thereby using the memory port (81) of an ARM-6 RISC processor core. The software process encapsulation P1 (82) represents the software I/O driver and copies data from port psw (79) to a specific memory address 0x08000 via an RPC call (84). The hardware process encapsulation P2 (83) represents the hardware counterpart and checks whether the memory address bus of the ARM (modeled by the protocol indices of the memory port (81)) equals 0x08000. If this is the case, data that is residing on the memory data bus of the ARM is copied to port phw (80) via an RPC call (85).

The library of I/O scenarios comprises

Memory-Mapped I/O scenarios. These provide a data-transfer mechanism that is convenient because it does not require the use of special processor instructions, and can implement practically as many input or output ports as desired. In memory-mapped I/O, portions of the address space are assigned to input and output ports. Reads and writes to those addresses are interpreted as commands to the I/O ports. "Sending" to a memory-mapped location involves effectively executing a "Store" instruction on a pseudo-memory location connected to an output port, and "Receiving" from a memory-mapped location involves effectively executing a "Load" instruction on a pseudo-memory location connected to an input port. When these memory operations are executed on the portions of address space assigned to memory-mapped I/O, the memory system ignores the operation. The I/O unit, however, sees the operation and performs the corresponding operation to the connected I/O ports. The number of memory locations assigned for memory-mapped I/O will depend on the number of ports that a software processor component has to "physically" implement. SYMPHONY proposes an assignment of address locations to channels that will result in simple address decoding logic. However, the user can always override the proposed assignment.

Instruction-Programmed I/O scenarios. Some processors also provide special instructions for accessing special I/O ports provided with the processor itself. Using this scheme, these special communication ports of the processor are connected to the external channels via the I/O unit.

In addition to providing hardware support for memory-mapped and instruction-programmed I/O, the I/O unit also provides support for hardware interrupt control. Interrupts are used for different purposes, including the coordination of interrupt-driven I/O transfers. Different processors provide different degree of hardware interrupt support. Some processors provide direct access to a number of dedicated interrupt signals. Our I/O unit architecture makes use of these signals when available. If more interrupt "channels" are required, for example, as required to support a number of interrupt-driven communication channels, we use the strategy of interrupt vectors. Interrupt vectors are pointers or addresses that tell the processor core where to jump to for the interrupt service routine. In effect, this is a kind of memory-mapped interrupt handling.

Once an I/O scenario is selected for every port of the software host-language encapsulation, SYMPHONY generates the necessary communication software and the corresponding hardware I/O unit by combining the selected I/O scenarios. The generated communication software, the software model of the processor core and the software host-language encapsulation itself are merged and compiled with the processor specific C-compiler.

The result of SYMPHONY is a refinement of the original host language encapsulation into a CoWare encapsulation of which the behavioral interface is identical to that of the original encapsulation.

In addition SYMPHONY, adds RAM and ROM blocks to store the program code and data (in FIG. 7, the RAM and ROM are not shown explicitly: they are part of the hardware interface).

The result of SYMPHONY is a refinement of the original host language encapsulation into a CoWare encapsulation of which the behavioral interface is identical to that of the original encapsulation. SYMPHONY effectively replaces a software encapsulation by a hardware encapsulation that has equivalent functionality.

In step (3) when two processors are not protocol compatible, a protocol conversion process is inserted. In FIG. 6, the VHDL net list representation of the processor (65) that was compiled with Cathedral-2/3 and the off-the-shelf processor (76) (VHDL net list representation) have incompatible protocols. Protocol conversion (77) is required to make them compatible.

Figure 9:
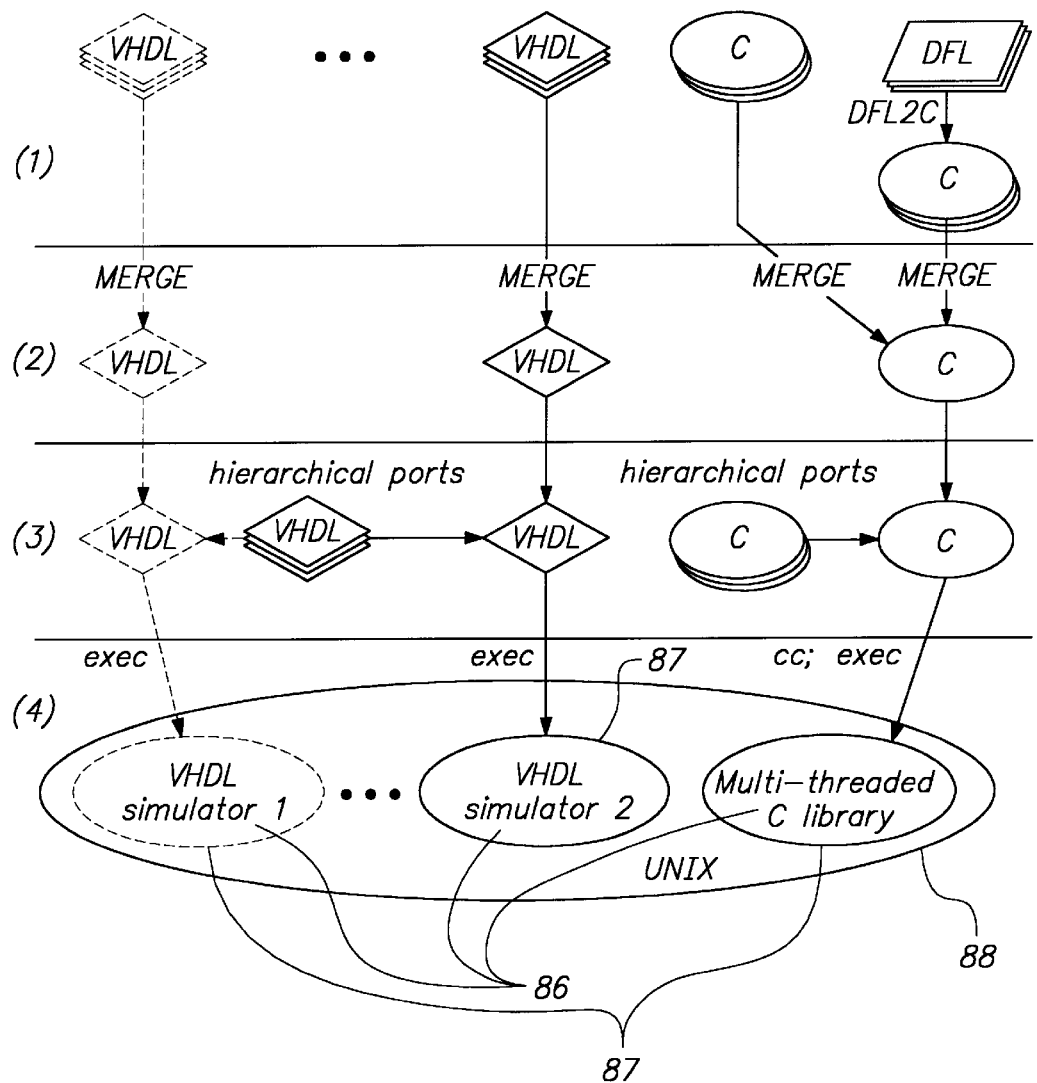
FIG. 9 is a flowchart of a specific embodiment of the construction of a hardware/software co-simulation according to the method of FIG. 2.

A digital system in the CoWare design environment can be simulated. Simulation is an implementation of the digital system on one or more general-purpose computers. The implementation process outlined above can be followed to construct a simulation. FIG. 9 illustrates the construction of a simulation. For simulation, the target processors are simulators (86) running on processes (87) of the operating systems (88) that run on the general-purpose computers. Currently, the simulators are a Synopsys VSS VHDL simulator, Leapfrog VHDL simulator, Cadence Verilog-XL Verilog simulator, native compiled code, DFL and Silage simulators. Each simulator runs in a Unix process on a HP 715/50, Sun, DEC or other workstation, or on a PC or other computer. All Unix processes may run on the same physical workstation or they may run on several workstations that are interconnected in a network. Allocation and assignment determine the simulation architecture. Arbitrary simulation architectures are supported by the CoWare design environment. Support is provided to select an optimal architecture for a given simulation speed and debugging visibility.

The host language compilers mentioned in step (1) are now the simulation engines for the host languages.

In step (2), the inter-process communication now consists of two parts. In a first part, the communication is realized from the simulation engine to the OS process on which the simulation engine is running. In a second part, the communication is realized between two different OS processes over the OS and network layer. The communication between the simulation engine and the OS process is performed via the application programmers interface of the simulation engine. The communication between two different OS processes is done through the OS inter-process communication primitives (e.g., shared memory and semaphores for two processes on a single OS, or TCP/IP sockets for two processes on distinct computers).

When the simulation engine used has a fixed interface as for example an instruction set simulator for a programmable processor, then the hardware software interface is generated with SYMPHONY and can be simulated as any other process.

The CoWare design environment supports multi abstraction level simulation which is the key for efficient co-simulation. It allows to simulate the processes under debug at an appropriate low level of abstraction for debugging purposes, while simulating the other processes in the system at the highest appropriate abstraction level for maximal speed. The time-consuming low abstraction level simulation is limited to the smallest possible part of the system under simulation, while still being able to simulate these parts in the system context.

Because both simulation and implementation follow the same design process, it is possible to construct hybrid simulation architectures in which part of the system is implemented by simulators running on OS processes and part of the system is implemented by actual hardware. This is just one more manifestation of the heterogeneity of digital system architectures.

In a specific embodiment of the present invention, an application is disclosed hereinbelow for a hardware/software co-design of a pager application.

SPECIFICATION OF THE PAGER

Figure 10:
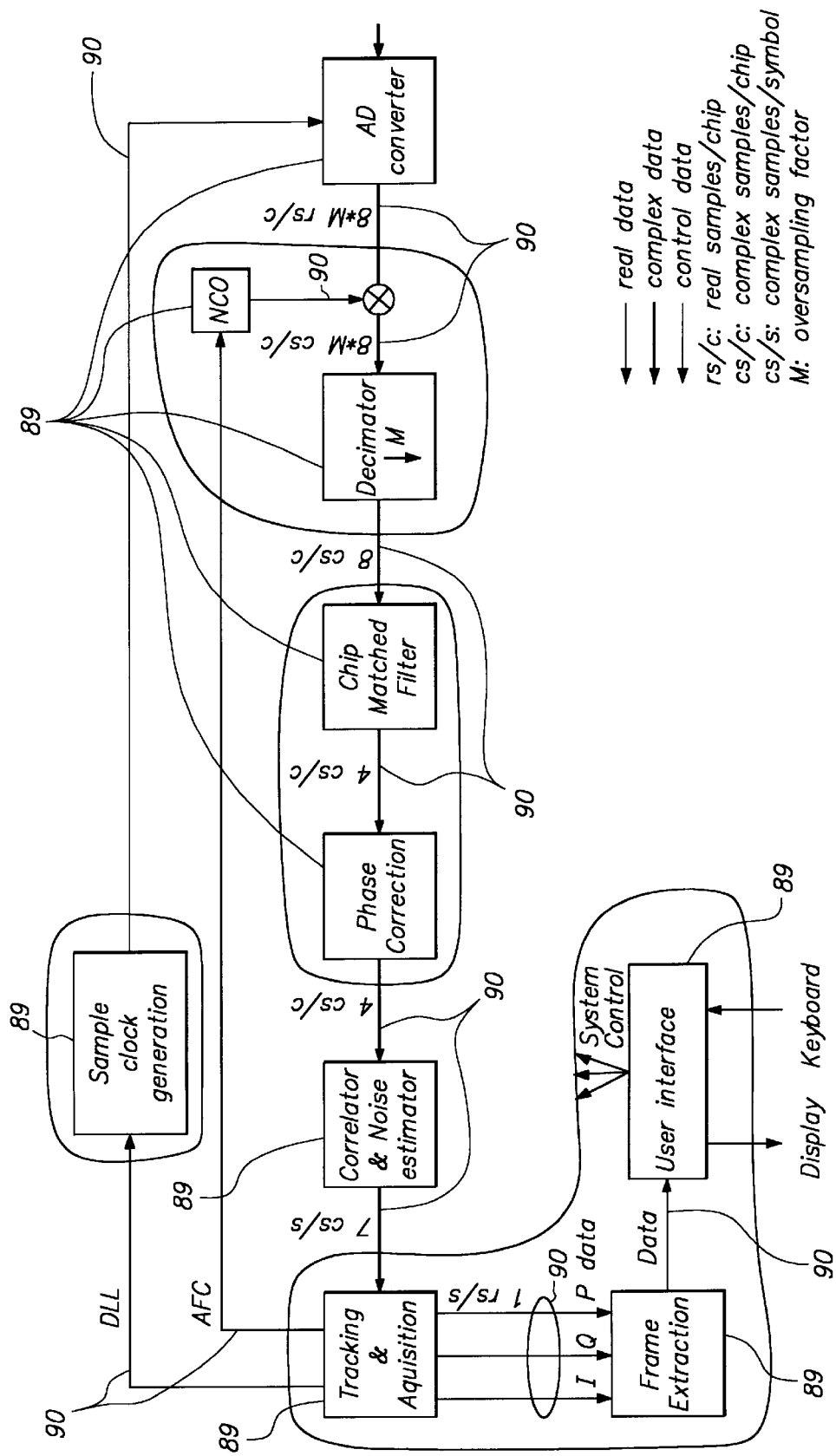
FIG. 10 is a block diagram of a typical heterogeneous digital system: a pager application.
Figure 11:
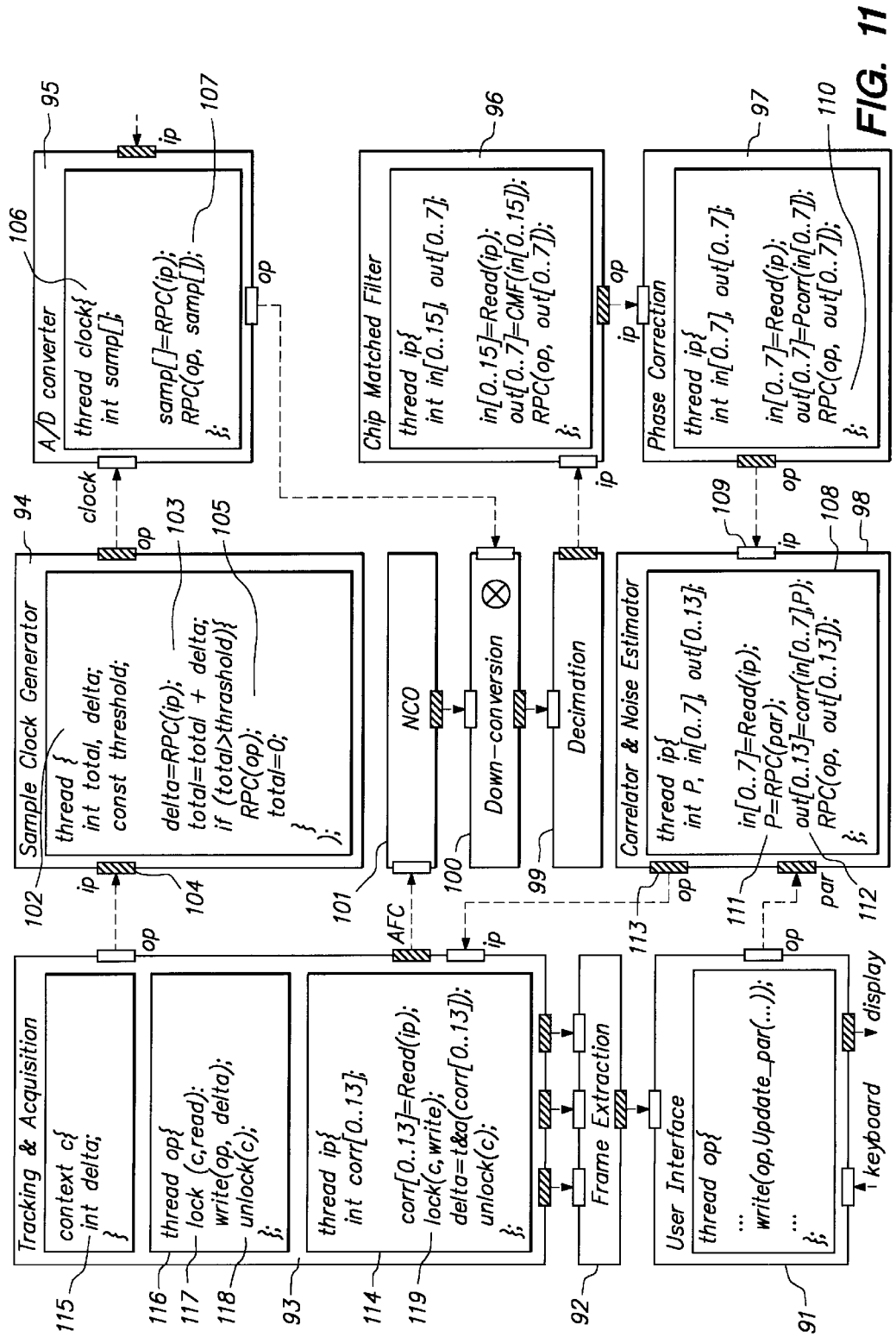
FIG. 11 is a schematic representation of the pager application, introduced in FIG. 10, as described with the present invention.

Each block (89) in FIG. 10 corresponds to a process implementing a specific function of the pager. This functional decomposition determines the initial partitioning. The lines with arrows (90) in between the processes represent primitive channels with RPC semantics. FIG. 11 shows the RPC communication in detail for part of the pager design. The blocks (91, 92, 93, 94, 95, 96, 97, 98, 99, 100, 101) in FIG. 11 correspond to the processes (89) from FIG. 10.

The Sample Clock Generator process (94) contains an autonomous thread (102). This thread runs continuously. It performs an RPC (103) over its input port ip (104) to the Tracking & Acquisition process (93) to obtain a new value for delta. The autonomous thread (102) of the process (94) adds the delta parameter to some internal variable until a threshold is exceeded. In this way it implements a sawtooth function. When the sawtooth exceeds the (fixed) threshold, an RPC call (105) is issued to the A/D converter process (95). The autonomous thread (102) of the Sample Clock Generator (94) performs an RPC (105) (gives a sample clock tick) every threshold/delta iterations (real clock cycles).

The slave thread clock (106) in the A/D converter process (95) samples the analog input, and sends the result to the Down-conversion process (100) via an RPC call (107). This in turn will activate the Decimation process (99) via an RPC call, etc.

The Correlator Noise Estimator process (98) contains a slave thread (108) associated with port ip (109) to compute the correlation values. This slave thread (108) is activated when the Phase Correction process (97) writes data to the Correlator Noise Estimator process (98) (i.e., when the Phase Correction process (97) performs an RPC (110) to the ip (109) port of the Correlator Noise Estimator process (98)). The slave thread (108) reads in the data and then performs an RPC (111) to the User Interface process (91) to obtain a new value for the parameter par that it requires for computing the correlation values. Finally, the new correlation results are sent to the Tracking Acquisition process (93) via an RPC call (112) on its op port (113).

The slave thread (114) in the Tracking Acquisition process (93) updates the delta value for the sawtooth function implemented by the Sample Clock Generator process (94). It puts the updated value in the context (115), where it is retrieved by the slave thread op (116) which serves RPC requests from the Sample Clock Generator process (94). In this way, the Tracking Acquisition process (93) influences the frequency of the clock generated by the Sample Clock Generator process (94). This example shows how the context (115) is used for communication between threads inside the same process whereas the RPC mechanism is used for communication between threads in different processes. The locking (117) and unlocking (118) of the context (115) is required to avoid concurrent accesses to the variable delta. The lock (117) in the slave thread op (116) locks the context (115) for read: other threads are still allowed to read from the context (115), but no other thread may write the context (115). The lock (119) in the slave thread ip (114) locks the context (115) for write: no other thread is allowed to write or read the context (115) until it is unlocked again.

Each process is described in the language that is best fit for the characteristics of the function it implements. The data-flow blocks (NCO (101), Down-conversion (100), Decimation (99), Chip Matched Filter (96), Phase Correction (97), Correlator Noise Estimator (98), and Sample Clock Generator (94)) are described in DFL. The control oriented blocks (Tracking Acquisition (93), Frame Extraction (92) and User Interface (91)) are described in C. The code in FIG. 11, is pseudo-code meant for illustration and does not correspond to the actual code.

DESIGN PROCESS

After the initial specification of the system has been validated by simulation, the designer starts the refinement process.

At this moment it is not yet decided what process will be implemented on what kind of target processor nor is it defined how the RPC communication will be refined. However, the choice of the specification language for each process restricts the choice of the component compiler and in that sense partly determines the target processor. Hence, studying possible alternative assignments of a process to a target processor may require the availability of a description of the process in more than one specification language or a clear guess of the best solution.

Allocation and Assignment

This step determines what processes will be implemented on what target processor. The initial specification shows the finest grain partitioning: a process in the initial specification will never be split over several processors. However, it may be worthwhile to combine a number of processes inside a single processor. This is achieved by merging these processes into a single process that can then be mapped on the selected target processor by a host language compiler. Merging of processes is only allowed when the processes are described in the same specification language. Hence, studying possible alternative mergers may require that for a number of processes (e.g., Correlator Noise Estimator process) a description is available in more than one specification language. After allocation and assignment, one obtains a description with a one-to-one mapping of merged processes to processors.

Figure 12:
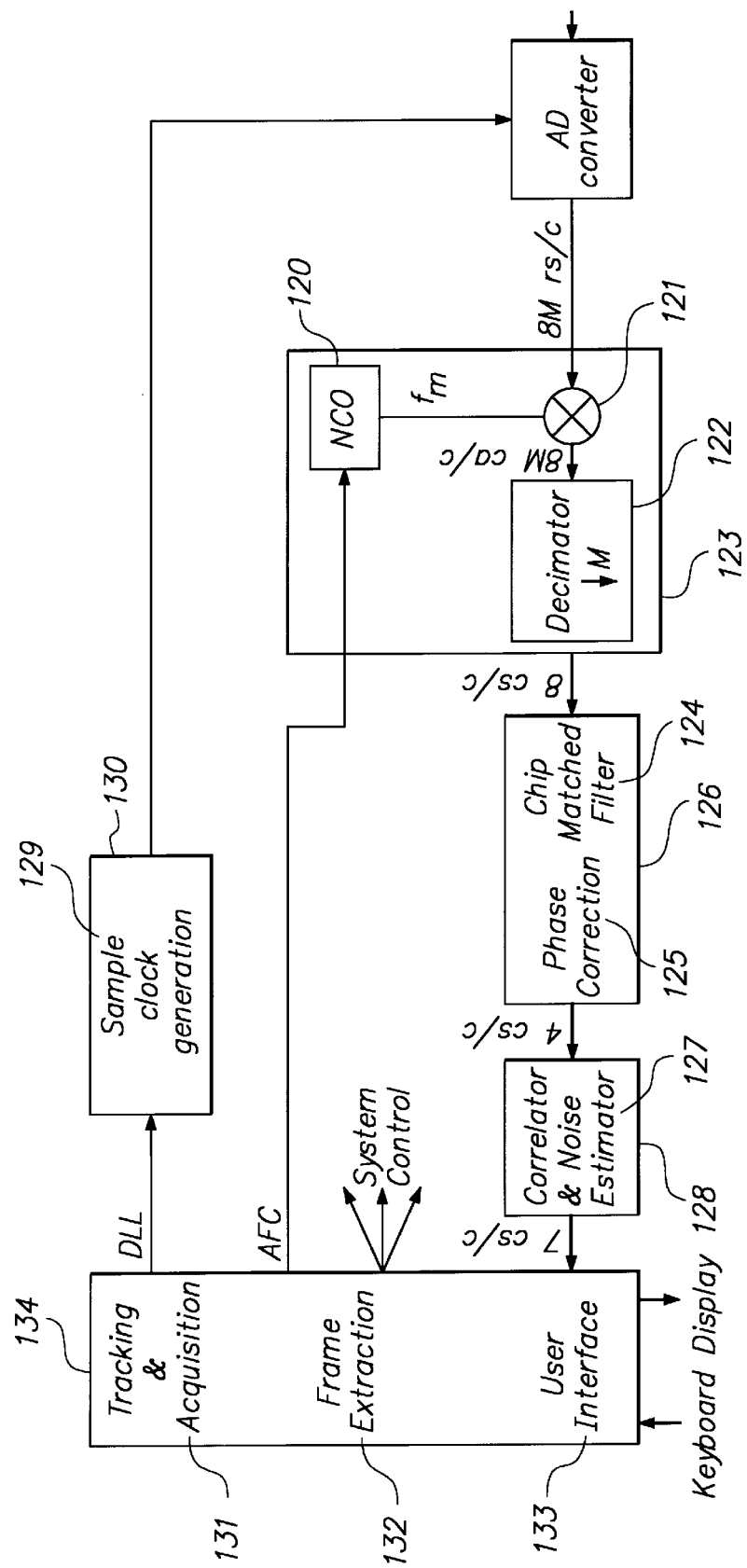
FIG. 12 is a block diagram of the pager introduced in FIGS. 10 and 11, after application of the process merge transformation an example of which was shown in FIG. 5.

In the pager example (FIG. 12), the following allocation, merging and assignment takes place. The NCO (120), Down-conversion (121), and Decimation (122) processes are merged and mapped in hardware onto an application specific DSP processor (123) because the sample rate of the merged processes is identical which implies that they can be clocked at the same frequency. The advantage is that only one clock tree needs to be generated per merged process (one per original process). An additional advantage is that the scan-chains for the processes that are merged can be combined.

The Chip Matched Filter (124), and Phase Correction (125) processes are merged and mapped onto a CATHEDRAL-3 processor (126) because their sample rates are identical. The Correlator Noise Estimator process (127) is mapped onto a CATHEDRAL-3 processor (128). It is not merged with the Phase Correction process (125) because it operates at a four time slower frequency. The Sample clock generator (129) is mapped onto a CATHEDRAL-3 processor (130).

Tracking Acquisition (131), Frame Extraction (132), and User Interface (133) are merged and mapped on a programmable processor (134). For this design an ARM6 processor is chosen. The Hardware/Software tradeoffs are based on the following observations. To obtain a maximal degree of flexibility as much of the functionality as possible is implemented in software on the ARM6 (134). However, due to performance constraints of the ARM6 processor (134), there is a limit to what can be implemented in software. The two main factors that play a role in this problem are:

(1) The Tracking Acquisition process (131) has to be implemented in software because the algorithm used to perform tracking and acquisition may be modified depending on the application domain of the pager system.

(2) The Correlator Noise Estimator process (127) is not included in software because the input rate for the Correlator Noise Estimator (127) is too high to realize a real-time communication between the ARM6 and the Phase Correction process (125). In addition, an estimation of the number of cycles required to execute each function on the ARM6 shows that the implementation of Correlator Noise Estimator process (127) in software leaves insufficient time to perform tracking and acquisition in between every two symbols.

After merging, each of the merged processes can now be implemented on a separate target processor by the appropriate compiler. The communication between the merged processes is still done via primitive ports and channels.

Communication Mechanism Selection

After the partitioning of the system has been verified by simulation and before the actual implementation takes place, the designer may choose to refine the communication mechanism between the processors. This can be achieved by making explicit the behavior of the channels between the processors.

Figure 13:
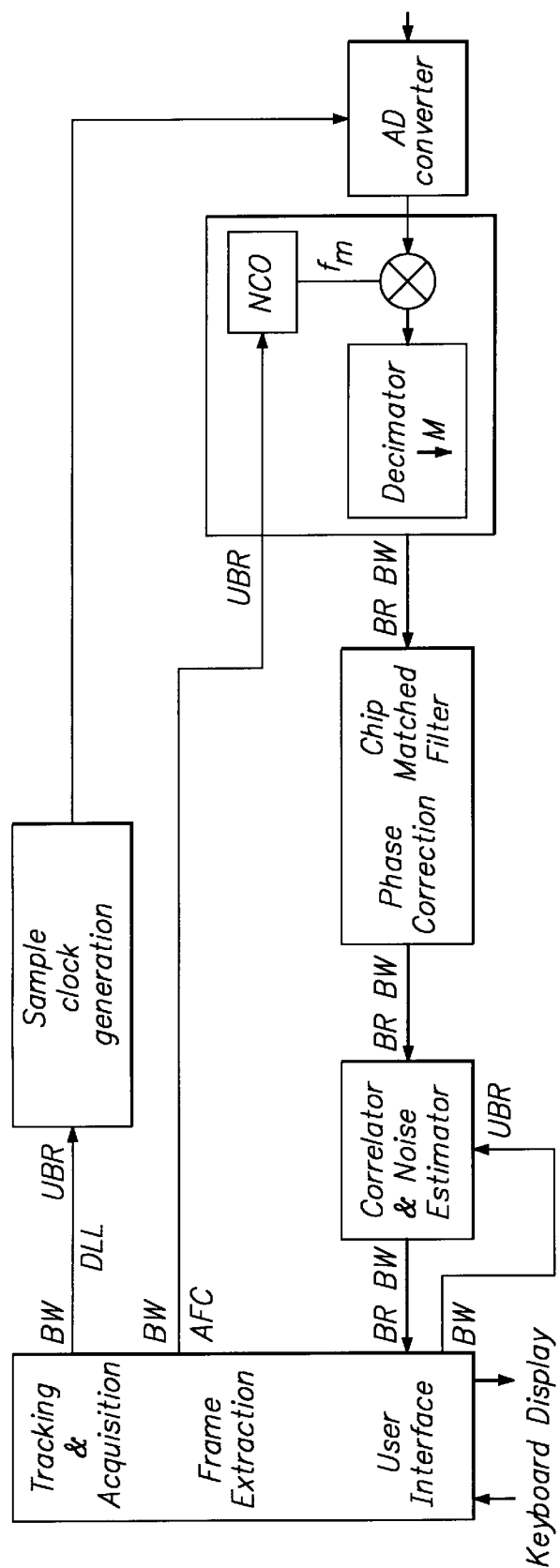
FIG. 13 is a block diagram of the pager using the results of the transformation of FIG. 12, after the communication channels have been tagged with a specific communication behavior.

In the running example, the processors can, in principle, operate concurrently because each processor has its own thread of control. By refining the RPC based communication scheme we can pipeline the processors: all processors operate concurrently and at I/O points they synchronize. This refined communication scheme is called Blocked/UnBlocked Read/Write communication. FIG. 13 shows the pager with the refined communication mechanism. The inputs and outputs of the processors have been labeled with BW for Blocked Write, BR for Blocked Read, and UBR for UnBlocked Read.

BW-BR communication guarantees that no data is ever lost. When the writing process has data available, it will signal that to the reading process. If the reading process is at that moment not ready to receive the data (because it is still processing the previous data), the writing process will block until the reading process is ready to communicate. Alternatively, if the reading process needs new data, it will signal that to the writing process. If the writing process is at that moment not ready to send the data (because it is still computing the data), the reading process will block until the writing process is ready to communicate. The BW-BR scheme is used in the main signal path.

A BW-BR scheme, however, is not used for the parameter and mode setting for the main signal path. If an accelerator uses BR to read a parameter value, it will be blocked until the parameter is provided. Since the parameter setting is done in software, this will slow down the computations in the main signal path considerably. Therefore parameter setting is done via a BW-UBR scheme. This makes sure that every parameter change is read by the accelerators, but it leaves it up to the accelerator to decide when to read the parameter.

In the CoWare design environment, the refinement of the communication mechanism is performed by making use of a hierarchical channel. A hierarchical channel replaces a primitive channel by a process that describes how communication over that channel is carried out.

Figure 14:
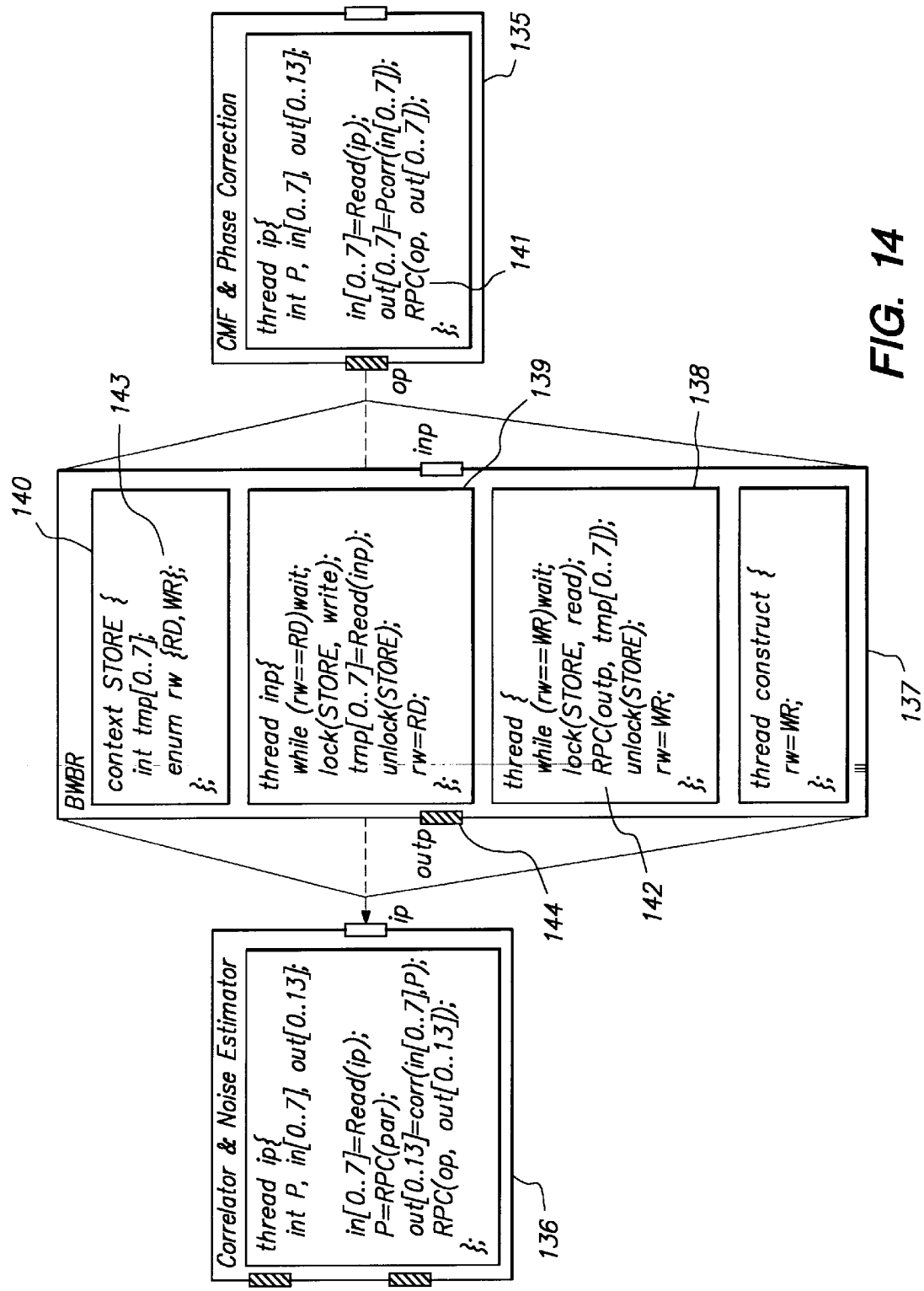
FIG. 14 is an illustration of the introduction of specific communication behavior in the pager application shown between the correlator & noise estimator and the CMF & phase correction blocks of FIG. 13 by refining a primitive channel into a hierarchical channel.

The introduction of BW-BR communication is shown in detail for the Chip Matched Filter & Phase Correction (135) and Correlator & Noise Estimator process (136) in FIG. 14.

The BWBR channel (137) contains a autonomous thread (138) and a slave thread (139) that communicate with each other via the shared variable tmp[0..7] in the context (140). The slave thread (139) is activated by an RPC (141) from the CMF & Phase Correction process (135) and it tries to update the context (140) with new values. The autonomous thread (138) continuously tries to read the values from the context (140) and send them to the output port (144) via an RPC (142), in this way activating the Correlation & Noise Estimator process (136) that is attached to that output (144). The blocking character of the communication is taken care of by the use of a binary semaphore rw (143). This guarantees that the input thread (139) will block until the previous data has been read by the autonomous thread (138) (no data is overwritten before it has been read), and that the autonomous thread (138) will block until new data is available (no data is read twice). When the input slave thread (139) is blocked, the CMF & Phase Correction process (135) that requested its service via an RPC (141) is also blocked because the RPC (141) will only return after the slave thread (139) has completed. When the autonomous thread (138) is blocked, there are no RPC requests to the Correlator Noise Estimator process (136), so that process (136) is blocked automatically.

In the case of Blocked-Write, UnBlocked Read communication, the code for the autonomous thread is slightly modified. The thread always sends the value stored in the context, without checking whether it is updated. The same value can be sent more than once, but the thread will never be blocked. The input slave thread is identical to the BWBR case, and will block until the data has been read.

In both cases, locking and unlocking of the context is required to avoid concurrent accesses to the shared variable in the context and, as such, has nothing to do with the blocking character of the communication.

Implementation of the Pager

After the newly introduced communication mechanism has been verified by simulation, each process has to be synthesized on its assigned target processor.

Implementation of a Process in Hardware

Figure 15:
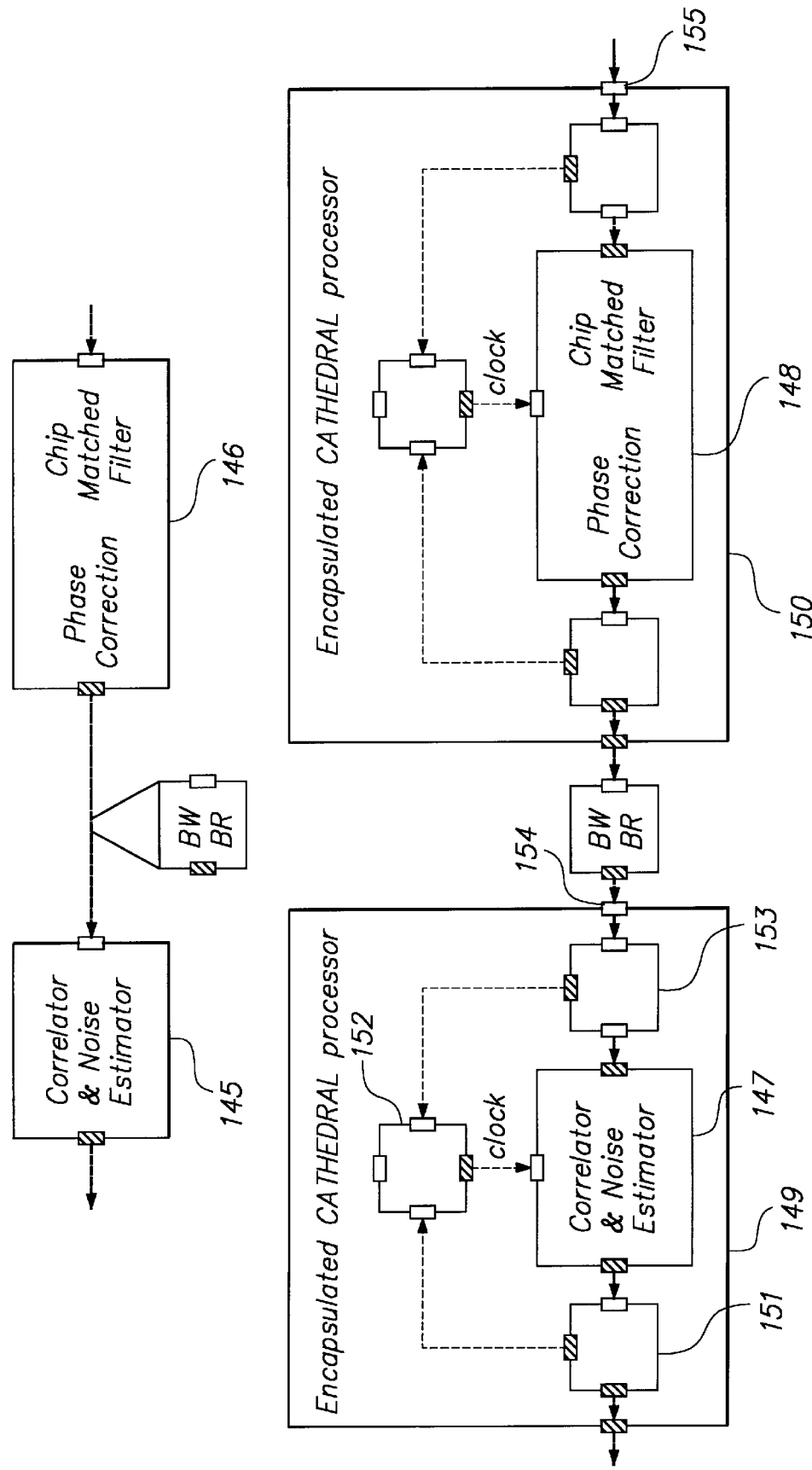
FIG. 15 is an illustration of the implementation of a process in hardware for the pager application using the communication behavior introduced in FIG. 14, whereby the resulting hardware subsystems are encapsulated to make them communicate.

FIG. 15 illustrates the pure hardware implementation for the Correlator & Noise Estimator process (145) and the merged Phase Correction and Chip Matched Filter process (146). This hardware implementation for the pager consists of three distinct steps:

The (merged) DFL processes are synthesized by the CATHEDRAL silicon compiler. The compiler generates processors of which all the inputs and outputs are of the master type. These processors are shown in FIG. 15 as the inner rectangles (147, 148).

Each processor is encapsulated to make it consistent with the specification in which the DFL processes have slave inputs. In addition, the encapsulation includes clock gating circuitry to control the activity of the processor. The encapsulated processors are shown in FIG. 15 as the big rectangles (149, 150): they include the processor generated by CATHEDRAL (147, 148) and some encapsulation hardware (151, 152, 153). As can be observed, the input ports (154, 155) of the encapsulated processors (149, 150) are now of the slave type. The encapsulation hardware (151, 152, 153) is shown in detail in FIG. 16 as the blocks (177, 156, 157).

Figure 16:
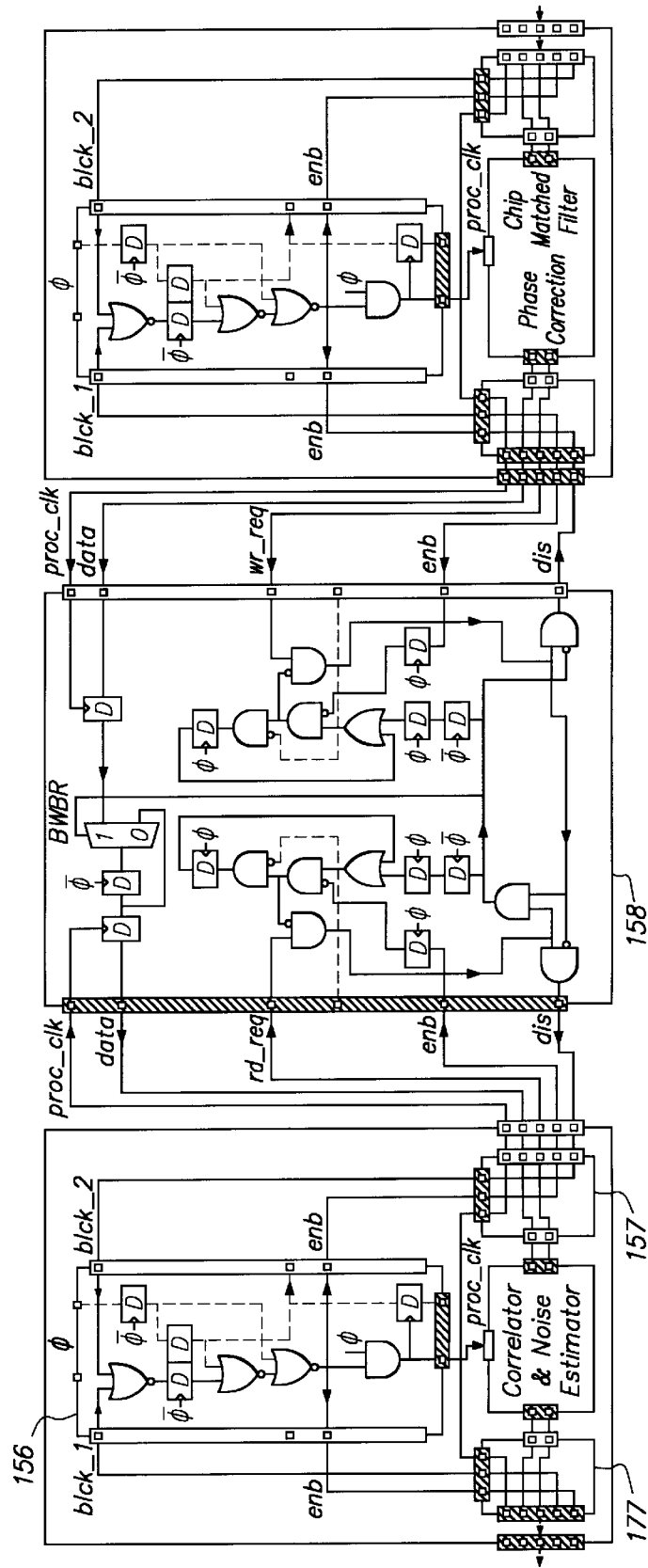
FIG. 16 shows the details of the encapsulation, shown in FIG. 15, of the hardware subsystems in this particular application.

The BWBR process is implemented in hardware. In this case we obtain the gate-level implementation of this process from the library. This implementation is functionally equivalent to the original C-like description (137) of this block in FIG. 14. FIG. 16 shows the detailed implementation (158) of the BWBR process that is used in the main signal path of the pager.

Implementation of a Process in Software

To simplify the discussion we will only look at the transfer of the 14 correlation values to the Tracking Acquisition process, and the setting of a parameter value by the User Interface. We also know that the transfer of the correlation values has to be BWBR and the transfer of the parameter value has to be BWUBR.

The hardware interface and the software I/O device driver is generated automatically with SYMPHONY. To generate these interfaces, SYMPHONY analyses the ports of the software process.

For each of these ports, SYMPHONY scans the library of I/O scenarios for an applicable scenario. The user is asked to select the most appropriate scenario amongst the applicable ones. SYMPHONY then combines the selected scenarios into a software I/O device driver and a hardware interface.

Figure 17:
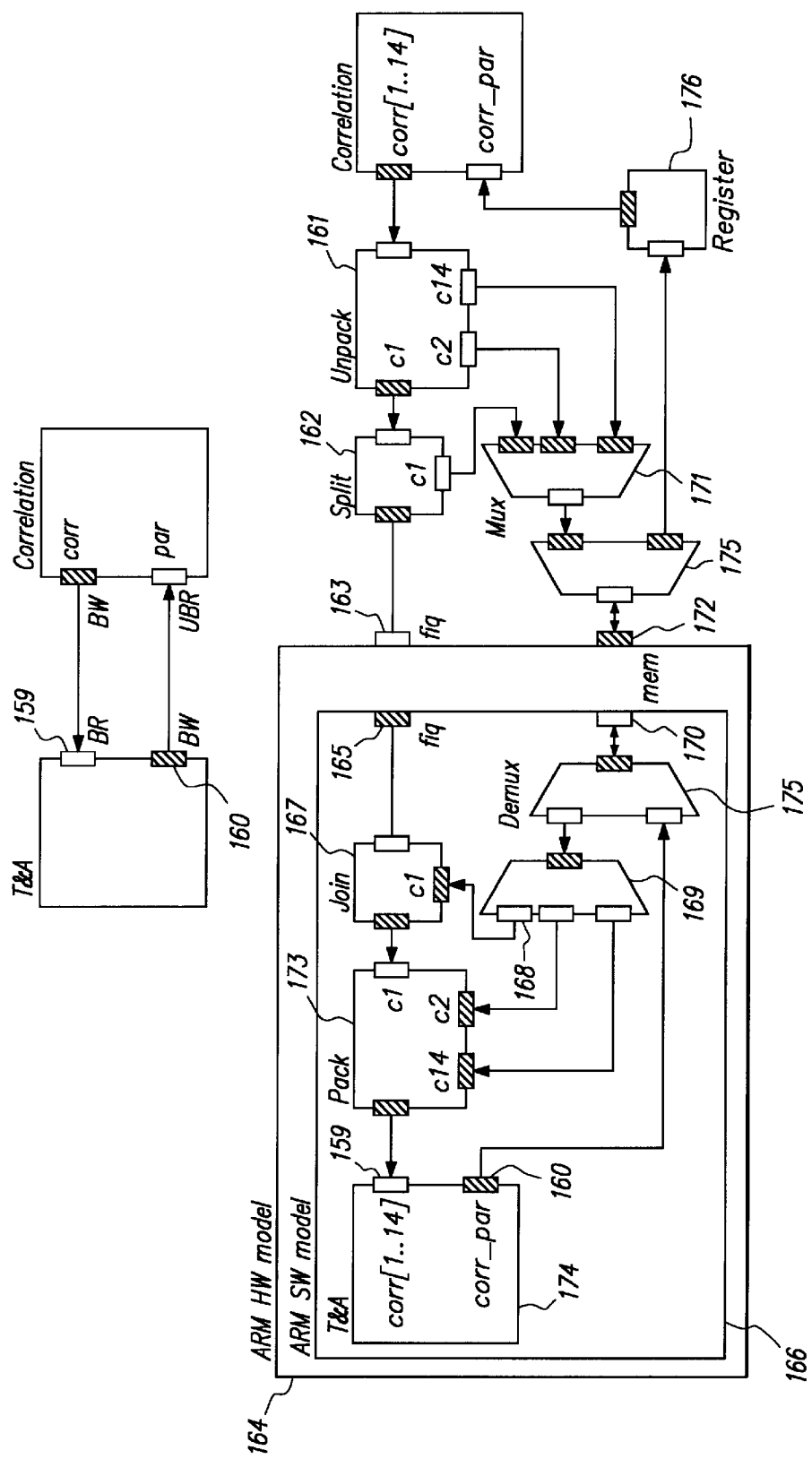
FIG. 17 is an illustration of the generation of an exemplary hardware/software interface between a software subsystem compiled on an ARM processor core and a hardware subsystem.

In the example shown in FIG. 17, there are two ports to be implemented:

bool [32][14] corr: inslave (159) is used to transfer the correlation values. This is a port of type inslave, that transports an array of 14 bit vectors of size 32.

bool par: outmaster (160) is used to set a parameter of the correlation block. This is a port of type outmaster, that transports a boolean value.

For the corr port (159), SYMPHONY proposes the scenario depicted in FIG. 17. The memory port of the ARM will be used to transfer the correlation values and the FIQ port of the processor will be used to initiate the transfer. The I/O scenario describes what blocks need to be inserted in software and hardware to realize this kind of communication. In total, three hardware and three software blocks are required to implement the communication over the corr port. The memory port of the ARM is obviously not wide enough to transfer the 14 correlation values in parallel. Therefore, the scenario will sequentialize the transfer. Of the 14 correlation values, 13 will be stored internally in the Unpack block (161). The 14th value is sent to the Split block (162).

Split (162) stores the 14th value internally and then activates the FIQ port of the ARM processor. Activating the FIQ port (163) of the hardware model (164) has a consequence that an RPC is issued on the interrupt port (165) of the software model (166). This port (165) is connected with the Join (167) block.

Join (167) retrieves the 14th correlation value by issuing an RPC to the corresponding input port (168) of the Demux block (169). The data transfer is implemented through memory mapped I/O. Therefore, when selecting this I/O scenario, the user should decide on the address that will be used for the transfer. When one of the input ports of the Demux block is activated, an RPC to the memory port (170) will be performed with an address that corresponds to the activated input port.

At the hardware side, the memory port (172) issues an RPC to the Mux block (171) whenever the port (172) is activated. In that block (171), the address will be decoded and the corresponding output port will be activated to retrieve the correlation value that was stored locally in hardware (either in the Split (162) or in the Unpack block (161)). After the 14th correlation value has been retrieved by the Join block (167), it is passed on to the Pack block (173), that will then retrieve the 13 other correlation values by issuing consecutive RPCs to the different ports of the Mux block (169). Finally, when the Pack block (173) has retrieved all 14 values, it packs them in an array and activates the original software application code in the Tracking & Acquisition process (174).

All these blocks are described in a generic way in a library where they can be retrieved and customized by SYMPHONY.

The solution for the corr_par port (160) is much simpler. Since it is an outmaster port it can directly be mapped on the memory port. However, since the memory port is already used, an extra multiplexer (175) is required. This is shown in FIG. 17. To implement the unblocking read character of the transfer, an extra register (176) is required on the hardware side.

Before going on with the implementation path, all processes that were added by SYMPHONY are merged. The hardware interfaces are merged into one hardware interface block that can then be implemented with Register Transfer level synthesis tools. The I/O device driver processes are merged with the original software application code. As a consequence of the in-lining, the complete tracking and acquisition slave thread moves in the interrupt routine. Whenever new correlation values are ready, the main software thread is interrupted to run the tracking and acquisition algorithm. After that interrupt is processed, the main thread resumes.

Figure 18:
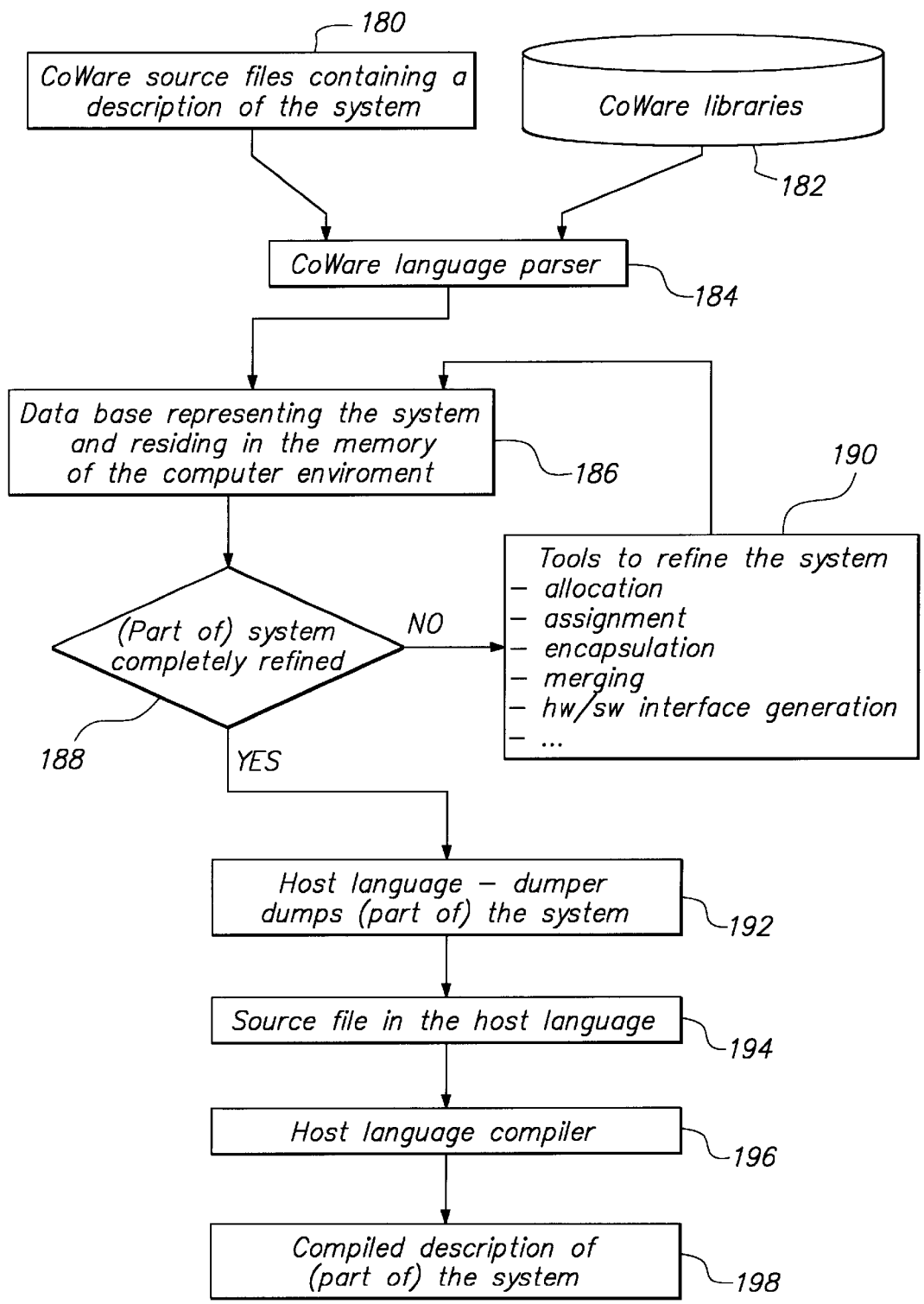
FIG. 18 is an operational flowchart for one presently preferred embodiment of the hardware/software codesign invention.

FIG. 18 is an operational flowchart for a presently preferred method of specifying a hardware/software codesign for an embedded system known as CoWare. At state 180, the system designer creates software source files containing a specification of the system. This initial specification is parsed, in conjunction with libraries of predefined routines 182, to result in a database of objects which is stored in the computer memory as shown at states 184, 186. The CoWare libraries contain processor models, I/O scenario models, protocol definitions, process definitions for use as hierarchical port or hierarchical channel, and so forth. The database could be construed using the Standards Components Library for Graphs, C++ Standard Components, Release 3.0, Copyright (c) 1991, 1992 AT&T and UNIX System Laboratories, Inc. This defines classes for each object in a graphical representation of the system undergoing codesign and has API functions that are used to build graphs, access elements of a graph, and so forth. In addition, the database requires library functions or tools that implement graph algorithms which correspond to the described merger, flattener, and other tools of CoWare.

Tools, which are independent software functions selectively used by the designer, operate on the database to refine the system representation. Each tool uses CoWare API functions to modify the database. A list of the more important sets of tools (listed at state 190) includes: allocation tools (see FIG. 5 and related discussion), assignment tools (see FIG. 5 and related discussion), encapsulation tools (see FIG. 2 generally and FIG. 3 specifically) and hardware/software interface tools (see FIG. 7 and related discussion on SYMPHONY). The SYMPHONY tool is available for license by COWARE, Inc., a subsidiary of IMEC of Leuven, Belgium. Below is a non-exhaustive list of tools with a short description of the function, the inputs and outputs of the tool. Since all tools work on the database representing the system, each tool has access to the complete system description (including all the process definitions, etc.). Therefore, this "INPUT" is not listed below. Since the libraries that can be used in CoWare are also parsed into the memory of the computer, each tool has, in principle, access to the library elements. Thus, the libraries are also not explicitly mentioned as "INPUT" below.

allocation
FUNCTION: add a number of processors to the system.
INPUT: list of available processors.
OUTPUT: system with allocated processors.
assignment
FUNCTION: assign processes to allocated processors
INPUT: list of processes in system description and list of allocated processors.
OUTPUT: system description in which processes assigned to the same processor are combined in separate CoWare language encapsulations, one CoWare language encapsulation per processor.
encapsulation
FUNCTION: make a process' communication consistent with the rest of the system.
INPUT: CoWare encapsulation.
OUTPUT: CoWare encapsulation with hierarchical ports for the process.
merging
FUNCTION: combine all processes of a CoWare encapsulation into a single process.
INPUT: CoWare encapsulation.
OUTPUT: host language encapsulation containing the merged code.
flattener
FUNCTION: flatten hierarchy.
INPUT: CoWare encapsulation.
OUTPUT: new CoWare encapsulation containing no other CoWare encapsulations.
hw/sw interfacing
FUNCTION: implement a process on a programmable processor and implement the communication between the processor and its environment.
INPUT: process definition.
OUTPUT: CoWare encapsulation containing the original process definition, the I/O device drivers, the hardware interfaces, the hardware and software model of the processor.
hw/hw interfacing
FUNCTION: implement communication between two connected ports. The communication implementation can be inserting a FIFO channel, or implementing protocol conversion, or so forth.
INPUT: CoWare encapsulation with a channel between two ports.
OUTPUT: CoWare encapsulation with a hierarchical channel that implements the communication.
dump<language> where <language>={VERILOG, VHDL, C, DFL, C++}
FUNCTION: extract host language code from host language encapsulation.
INPUT: host language encapsulation.
OUTPUT: host language code.

At decision state 188 the system design determines if the system (or a selected portion of the system) is completely refined or is refined as far as required. If not, a loop comprising states 186, 188 and 190 is repeated until the system is completely refined, as determined at decision state 188, and the system designer continues at state 192. At state 192, the system (or system portion) is extracted from the data base by a host language "dumper". The result of the host language dumper is a source file of the system (as shown in state 194) in the corresponding host language, e.g., VERILOG, VHDL, C, DFL, or C++. Proceeding to state 196, the system designer can compile the source file using a traditional host language compiler to generate a compiled description of the system (or system portion) as shown in state 198. This compiled description may be, for example, an executable for a computer (for a simulation), a gate level net list (for a VHDL simulation), or a net list describing the final implementation of the system.

In the above description a design environment and a design methodology meeting the requirements of modularity, encapsulation of different description languages, modeling from a heterogeneous conceptual specification to a resulting heterogeneous architecture and all refinement steps in between, modeling capabilities for off-the-shelf components and the associated design environments, separation between functional and communication behavior and processor independent interface synthesis have been disclosed. Yet it is apparent that other embodiments of the present invention may be obvious to the person skilled in the art, the spirit and scope of the present invention being limited only by the terms of the appended claims.

What is claimed is:

1. A database compiled on a computer environment, adapted for access by executable programs on said environment for generating the implementation of an heterogeneous essentially digital system, comprising:

a plurality of objects representing aspects of said digital system wherein said objects comprise primitive objects representing the specification of said digital system and hierarchical objects being created by said executable programs while generating the implementation of said digital system, said primitive objects comprising ports, protocols, and channels, at least one primitive port having at least one primitive protocol, said hierarchical objects being successive refinements in a chain of refinements of said primitive objects, having more detail and preserving any one or all of said aspects to thereby generate said implementation of said digital system;

relations in between said primitive objects and in between said hierarchical objects and between said primitive objects and said hierarchical objects; and functions for manipulating said objects and said relations.

2. The database as recited in claim 1 wherein said implementation is a simulation of said digital system.

3. The database as recited in claim 2 wherein said simulation is a multi-abstraction level simulation, said multi-abstraction level simulation comprising substantially simultaneous low-level and high-level simulation.

4. The database as recited in claim 2 wherein said simulation is a multi-platform simulation being executed on a plurality of computers.

5. The database as recited in claim 2 wherein said simulation is a hybrid simulation comprising substantially simultaneous hardware implementations and computer simulations.

6. The database as recited in claim 1 wherein said implementation is a heterogeneous implementation comprising hardware subsystems and software subsystems, said software subsystems being executed on one or more of said hardware subsystems.

7. The database as recited in claim 6 wherein said hardware subsystems comprise any one or more of processor cores, off-the-shelf components, custom components, ASICs, processors, and boards.

8. The database as recited in claim 7 wherein said software subsystems comprise machine instructions for said hardware subsystems.

9. The database as recited in claim 1 wherein said specification is a heterogeneous specification comprising a plurality of behavioral and structural languages.

10. The database as recited in claim 1 wherein said aspects comprise any one or more of functional, communication, concurrency and structural aspects of said digital system.

11. The database as recited in claim 10 wherein said objects representing said functional aspects comprise any one or more of host language encapsulations, threads, and context.

12. The database as recited in claim 10 wherein said objects representing said communication aspects comprise any one or more of ports, protocols, channels, and context.

13. The database as recited in claim 10 wherein said objects representing said concurrency aspects comprise host language encapsulations and threads.

14. The database as recited in claim 10 wherein said objects representing said structural aspects comprise any one or more of host language encapsulations, ports, channels, and instances.

15. The database as recited in claim 10 wherein said functional aspects and said communication aspects of said specification are split into first primitive objects representing said functional aspects and second primitive objects representing said communication aspects.

16. The database as recited in claim 15 wherein said first primitive objects are host language encapsulations and wherein said second primitive objects comprise said ports, said protocols, and said channels, one port having one protocol.

17. The database as recited in claim 16 wherein said ports are connected by channels, the communication between said ports over said channels being conducted according to remote-procedure-call semantics.

18. The database as recited in claim 15 wherein said second primitive objects are refined into second hierarchical objects for adding implementation detail to the communication behavior of said second primitive objects.

19. The database as recited in claim 15 wherein said concurrency aspects are inter-process concurrency aspects and intra-process concurrency aspects.

20. The database as recited in claim 15 wherein said communication aspects are intra-process communication aspects, inter-process communication aspects with remote-procedure-call semantics, and inter-process communication aspects with a hierarchical protocol.

21. The database as recited in claim 20 wherein said intra-process communication occurs between threads of a single process by shared variables in the context.

22. The database as recited in claim 20 wherein said inter-process communication with remote-procedure-call semantics occurs between a slave thread of a first process and a thread of a second process according to remote-procedure-call semantics.

23. The database as recited in claim 22 further comprising process merging functionality whereby the inter-process communication with remote-procedure-call semantics between a plurality of processes is removed by merging said plurality of processes.

24. The database as recited in claim 20 wherein said inter-process communication with a hierarchical protocol occurs between a thread of a first process and a thread of a second process according to the semantics of said hierarchical protocol.

25. The database as recited in claim 1, wherein said refinements are individual refinements.

26. The method as recited in claim 1, wherein each primitive port has at least one primitive protocol.

27. A design environment, compiled on a computer environment, for implementing an heterogeneous essentially digital system, comprising:

a database compiled on said computer, adapted for access by executable programs on said computer for generating the implementation of said heterogeneous essentially digital system, comprising a plurality of objects representing aspects of said digital system wherein said objects comprise primitive objects representing the specification of said digital system and hierarchical objects being created by said executable programs while generating the implementation of said digital system, said hierarchical objects being refinements of said primitive objects, having more detail and preserving any one or all of said aspects to thereby generate said implementation of said digital system; and further comprising relations in between said primitive objects and in between said hierarchical objects and between said primitive objects and said hierarchical objects; and further comprising functions for manipulating said objects and said relations;

means for specifying said heterogeneous digital system comprising a plurality of behavioral and structural languages;

means for simulating said heterogeneous digital system comprising a plurality of simulators for said behavioral and structural languages;

means for implementing said heterogeneous digital system comprising a plurality of compilers for said behavioral and structural languages;

means for allocating hardware components for an implementation of said heterogeneous digital system;

means for assigning hardware subsystems and software subsystems of said heterogeneous digital system to said hardware components;

means for implementing the communication between said software subsystems and said hardware subsystems, one of the aspects of said communication being represented by ports; and means for encapsulating said simulators, said compilers, said hardware components, said hardware subsystems and said software subsystems, thereby creating a consistent communication between said encapsulated simulators, compilers, hardware components, hardware subsystems and software subsystems.

28. A design environment as recited in claim 27 further comprising means for creating processor models of said hardware components as objects in said database, said models comprising software models representing the software views on said hardware components and hardware models representing the hardware views on said hardware components.

29. The design environment as recited in claim 28 further comprising means for creating I/O scenario models of said ports as objects in said database, said I/O scenario models representing the implementation of said ports on said hardware components, said implementation comprising software subsystems, hardware subsystems, and processor models with connections therebetween.

30. The design environment as recited in claim 29 wherein the implementation of the communication between a first software subsystem and a first hardware subsystem results in said first software subsystem with a first port being replaced by a second hardware subsystem with a second port, said first port and said second port representing an essentially identical communication.

31. The design environment as recited in claim 30 further comprising:
 means for selecting I/O scenario models for the ports of said first software subsystem;
 means for combining the software subsystems of said selected I/O scenarios; and
 means for combining the hardware subsystems of said selected I/O scenarios.

32. The design environment as recited in claim 31 wherein a first I/O scenario model represents the connection of said first port to said second port, said connection comprising a connection of said first port to said software subsystems of said I/O scenario model, connections of said software subsystems of said I/O scenario model to said software model, connections of said hardware model to said hardware subsystems of said I/O scenario model, and a connection of said hardware subsystems of said I/O scenario model to said second port.

33. The design environment as recited in claim 32 wherein I/O scenario models comprise any one or more of memory mapped I/O scenarios, instruction programmed I/O scenarios, and interrupt based I/O scenarios.

34. A method of making an implementation of an heterogeneous essentially digital system, comprising the steps of:
 defining a first set of primitive objects representing the specification of said digital system, comprising the steps of:
  describing the specification of said system in one or more processes, each process representing a functional aspect of said system, said processes being primitive objects;
  defining ports and connecting said ports with channels, said ports structuring communication between said processes, said ports and said channels being primitive objects, one process having one or more ports, at least one port having at least one protocol;
  defining communication semantics of said ports by a protocol, said protocol being a primitive object;
 and thereafter
 creating hierarchical objects by successive refinements in a chain of refinements of said primitive objects and having more detail, while preserving aspects of said communication semantics.

35. The method as recited in claim 34 further comprising the step of simulating said system.

36. The method as recited in claim 34 wherein said implementation comprises hardware and software subsystems of said system, said software subsystems being executed on one or more of said hardware subsystems.

37. The method as recited in claim 36 wherein said hardware subsystems comprise any one or more of processor cores, off-the-shelf components, custom components, ASICs, processors, and boards.

38. The method as recited in claim 37 further comprising the step of generating a net list comprising the layout information of said implementation.

39. The method as recited in claim 34 further comprising the steps of:
 allocating one or more hardware components, said components comprising programmable processors and non-programmable processors; and
 assigning said processes to said hardware components, the processes being assigned to a programmable processor being a software subsystem, the other processes being hardware subsystems.

40. The method as recited in claim 39 further comprising the step of selecting I/O scenario models for the ports of said software subsystem thereby connecting said ports to the interface of said programmable processor and connecting the interface of said programmable processor to second ports, said second ports representing an essentially identical communication as said ports.

41. The method as recited in claim 40 further comprising the step of refining the channel in between a first and a second port of respectively a first and a second hardware component, said first and said second port having an incompatible protocol, thereby creating a hierarchical channel, said hierarchical channel converting the first protocol into the second protocol.

42. The method as recited in claim 40 further comprising the step of refining the channels in between incompatible ports of hardware components, thereby creating hierarchical channels.

43. The method as recited in claim 42 wherein said hardware subsystems comprise any one or more of processor cores, off-the-shelf components, custom components, ASICs, processors, and boards.

44. The method as recited in claim 43 further comprising the step of generating a net list comprising the layout information of said implementation.

45. The method as recited in claim 34, wherein said refinements are individual refinements.

46. The method as recited in claim 34, wherein each port has at least one protocol.

* * * * *